(12) United States Patent
Miyamoto et al.

(10) Patent No.: US 10,409,125 B2
(45) Date of Patent: Sep. 10, 2019

(54) DISPLAY DEVICE

(71) Applicant: Japan Display Inc., Minato-ku (JP)

(72) Inventors: Motoharu Miyamoto, Tokyo (JP);
Yoshinori Aoki, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/936,832

(22) Filed: Mar. 27, 2018

(65) Prior Publication Data

US 2018/0307109 A1    Oct. 25, 2018

(30) Foreign Application Priority Data

Apr. 20, 2017  (JP) .................................. 2017-083723

(51) Int. Cl.
| | |
|---|---|
| *G02F 1/1362* | (2006.01) |
| *H01L 27/12* | (2006.01) |
| *G02F 1/1368* | (2006.01) |
| *G02F 1/1335* | (2006.01) |
| *G02F 1/136* | (2006.01) |

(52) U.S. Cl.
CPC ...... *G02F 1/136286* (2013.01); *G02F 1/1368* (2013.01); *G02F 1/133512* (2013.01); *G02F 1/133514* (2013.01); *H01L 27/124* (2013.01); *G02F 2001/13606* (2013.01); *G02F 2201/121* (2013.01); *G02F 2201/123* (2013.01)

(58) Field of Classification Search
CPC ........... G02F 1/136286; G02F 2201/12; G02F 2201/121; G02F 2201/123; H01L 27/124
See application file for complete search history.

(56) References Cited

U.S. PATENT DOCUMENTS

| 9,348,190 | B2 | 5/2016 | Koide | |
|---|---|---|---|---|
| 2016/0247825 | A1* | 8/2016 | Katsuta | ............... H01L 27/1222 |
| 2017/0193966 | A1* | 7/2017 | Tsuei | ................ G02F 1/133345 |
| 2018/0076224 | A1* | 3/2018 | I | ........................... H01L 27/124 |

FOREIGN PATENT DOCUMENTS

JP    2014-139645    7/2014

* cited by examiner

*Primary Examiner* — Michael Pervan
(74) *Attorney, Agent, or Firm* — Oblon, McClelland, Maier & Neustadt, L.L.P.

(57) ABSTRACT

A display device includes, on an insulating substrate, a plurality of scanning lines, a plurality of signal lines, a plurality of sub-pixel regions each surrounded by a pair of scanning lines and a pair of signal lines, a plurality of semiconductor layers in the sub-pixel regions, and a base electrode connected to one end of the semiconductor layer. The other end of the same is connected to one of the pair of signal lines. When it is assumed that a signal connected to the semiconductor layer is a first signal line while a signal line not connected to the semiconductor layer is a second signal line in each sub-pixel region, a distance between the first signal line and the semiconductor layer is larger than a distance between the second signal line and the semiconductor layer at a connecting position between the semiconductor layer and the base electrode in plan view.

11 Claims, 15 Drawing Sheets

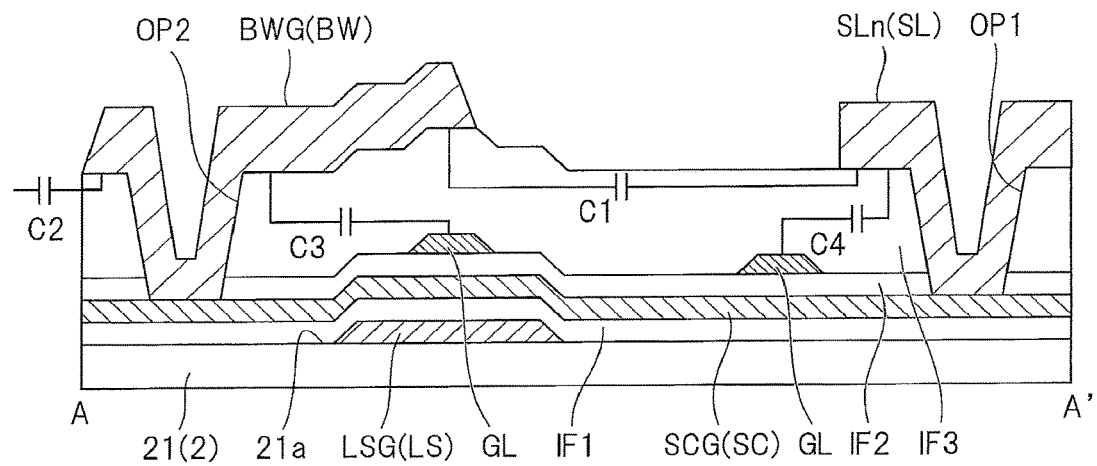
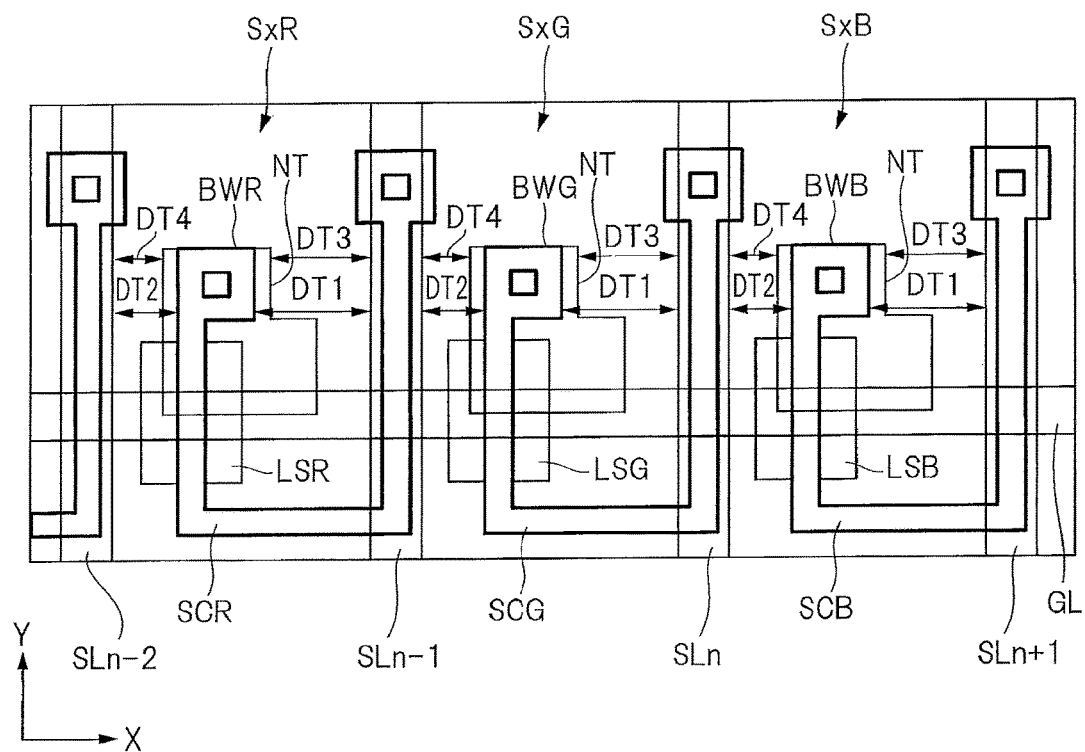

DISPLAY DEVICE

CROSS-REFERENCE TO RELATED APPLICATION

The present application claims priority from Japanese Patent Application No. 2017-83723 filed on Apr. 20, 2017, the content of which is hereby incorporated by reference into this application.

TECHNICAL FIELD OF THE INVENTION

The present invention relates to a display device. For example, the present invention relates to a technique effectively applied to a display device having a plurality of pixels provided in a display region.

BACKGROUND OF THE INVENTION

A display device is cited, the display device displaying images by supplying scanning signals to a plurality of pixels provided in a display region via a plurality of scanning lines and supplying pixel signals to the same via a plurality of signal lines. In such a display device, the plurality of pixels are formed in regions where the plurality of scanning lines and the plurality of signal lines intersect each other.

For example, Japanese Patent Application Laid-open Publication No. 2014-139645 (Patent Document 1) describes a technique having a structure in a liquid crystal display panel in which a plurality of scanning lines and a plurality of signal lines are arranged so as to intersect each other and in which an extended portion protruding from each scanning line overlaps each signal line.

SUMMARY OF THE INVENTION

In recent years, because of requirement for high resolution in display devices, the number of pixels increases, and therefore, the number of wirings (for example, signal lines) increases. Therefore, there is a problem of increase in a parasitic capacitance between the wiring and the pixel, which results in a deterioration in image quality.

The present invention has been made to solve the problem in the conventional technique as described above, and an object of the present invention is to provide a display device that improves the image quality by reducing the parasitic capacitance acting between the wiring and the pixel.

The summary of the typical aspects of the inventions disclosed in the present application will be briefly described as follows.

A display device according to an aspect of the present invention includes, on an insulating substrate: a plurality of scanning lines; a plurality of signal lines; a plurality of sub-pixel regions each surrounded by a pair of scanning lines and a pair of signal lines; a plurality of semiconductor layers formed in sub-pixel region, respectively; and a metal layer connected to one end of the semiconductor layer. The other end of the semiconductor layer is connected to one of the pair of signal lines. When it is assumed that a signal line connected to the semiconductor layer is a first signal line while a signal line not connected to the semiconductor layer is a second signal line in each of the sub-pixel regions, a distance between the first signal line and the semiconductor layer is larger than a distance between the second signal line and the semiconductor layer at a connecting position between the semiconductor layer and the metal layer in plan view.

BRIEF DESCRIPTIONS OF THE DRAWINGS

FIG. 8 is a cross-sectional view taken along a line A-A' of FIG. 7;

FIG. 9 is a plan view showing an example of arrangement of a pixel in a display device according to a second embodiment;

DESCRIPTIONS OF THE PREFERRED EMBODIMENTS

Figure 1:
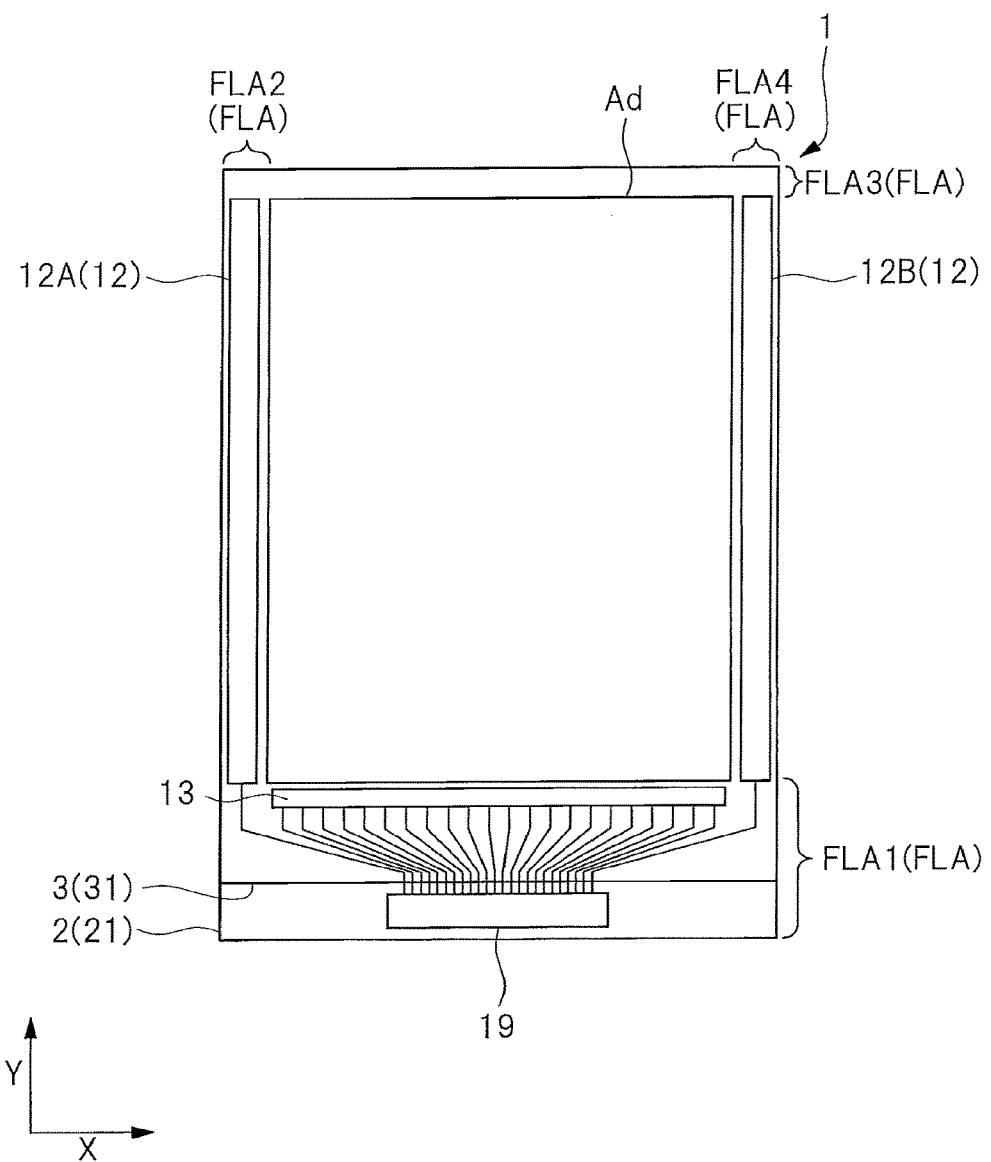
FIG. 1 is a plan view showing an example of a module on which a display device according to a first embodiment is mounted.

Hereinafter, each embodiment of the present invention will be described with reference to the accompanying drawings.

Note that only one example is disclosed, and appropriate modification with keeping the concept of the present invention which can be easily anticipated by those who skilled in the art is obviously contained in the scope of the present invention. Also, in order to make the clear description, a width, a thickness, a shape, and others of each portion in the drawings are schematically illustrated more than those in an actual aspect in some cases. However, the illustration is only an example, and does not limit the interpretation of the present invention.

In the present specification and each drawing, similar elements to those described earlier for the already-described drawings are denoted with the same reference characters, and detailed description for them is appropriately omitted in some cases.

Further, in some drawings used in the embodiments, hatching is omitted even in a cross-sectional view so as to make the drawings easy to see in some cases. Also, hatching is used even in a plan view so as to make the drawings easy to see in some cases.

First Embodiment

The techniques described in the following embodiments can be widely applied to a display device in which a plurality of elements provided in a display region provided with a display function layer has a mechanism for supplying signals from the circumference of the display region. The following embodiments will exemplify a liquid crystal display device as a typical example of the display devices.

<Module>

FIG. 1 is a plan view showing an example of a module on which a display device according to the first embodiment is mounted.

As shown in FIG. 1, a display device 1 includes an array substrate 2 including a substrate 21 and a counter substrate 3 including a substrate 31.

The substrate 21 includes a display region Ad and a frame region FLA. The display region Ad is a region close to an upper surface 21a (see FIG. 2 described later) as a main surface of the substrate 21, and is a region provided with a plurality of pixels Px (see FIG. 4 described later). That is, the display region Ad is a region in which an image is displayed. The frame region FLA is a region close to the upper surface 21a (see FIG. 2 described later) as a main surface of the substrate 21, and is a region closer to the outer circumference side of the substrate 21 than the display region Ad. That is, the frame region FLA is a region in which no image is displayed.

It is assumed that two directions that intersect each other, preferably orthogonally cross each other in the upper surface 21a as the main surface of the substrate 21 are referred to as an X-axis direction as a first direction and a Y-axis direction as a second direction. In the example shown in FIG. 1, the substrate 21 has a rectangular shape having two sides extending in the X-axis direction and two sides extending in the Y-axis direction in plan view. For this reason, in the example shown in FIG. 1, the frame region FLA is a frame-shaped region around the display region Ad.

Note that the term "in plan view" in the specification of the present application indicates a case of view from a direction perpendicular to the upper surface 21a (see FIG. 2 described later) as the main surface of the substrate 21. In the following description, the term "on the upper surface 21a as the main surface of the substrate 21" is sometimes simply referred to the term "on the substrate 21".

In the specification of the present application, the term "the positive side in the X-axis direction" indicates the side to which the arrow indicating the X-axis direction in FIG. 1 extends, and the term "the negative side in the X-axis direction" indicates the opposite side to the above-described "positive side". The same applies to the positive and negative sides in the Y-axis direction.

In the specification of the present application, a direction in which an insulating film IF and a transistor Tr are stacked on the substrate 21 is assumed to be an "upper" direction, and a direction opposite to the "up" direction is assumed to be a "lower" direction unless otherwise specified.

A chip on glass (COG) structure is formed on the substrate 21, and a semiconductor chip (an integrated circuit: IC) 19 is mounted on the substrate 21. The semiconductor chip 19 is a controller embedding circuits necessary for display operations therein.

A source driver 13 is provided on the substrate 21. The source driver 13 may be embedded in the semiconductor chip 19.

Gate drivers 12A and 12B as gate drivers 12 are provided on the substrate 21. The gate drivers 12A and 12B are provided in the frame region FLA.

In this case, it is assumed that a region of the frame region FLA, the region being closer to the negative side than the display region Ad in the Y-axis direction, is a frame region FLA1, and that a region of the frame region FLA, the region being closer to the negative side than the display region Ad in the X-axis direction, is a frame region FLA2. In addition, it is assumed that a region of the frame region FLA, the region being closer to the positive side than the display region Ad in the Y-axis direction, is a frame region FLA3, and that a region of the frame region FLA, the region being closer to the positive side than the display region Ad in the X-axis direction, is a frame region FLA4.

In this case, the gate driver 12A is provided in the frame region FLA2, and the gate driver 12B is provided in the frame region FLA4. In addition, the gate drivers 12A and 12B are provided to sandwich the display region Ad. As will be described later with reference to FIG. 3, many pixels Px constituted by a plurality of sub-pixels Sx are arranged in a matrix pattern in the display region Ad.

<Display Device>

Figure 2:
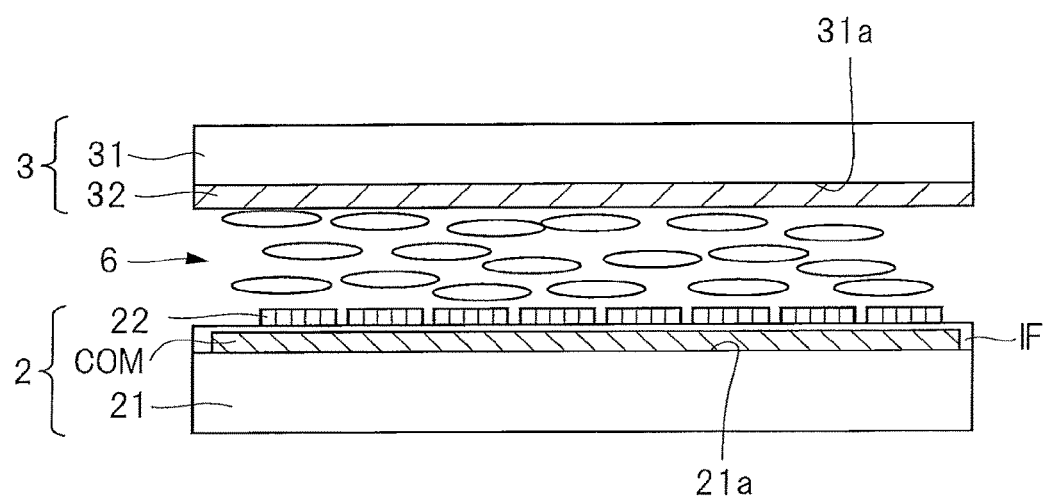
FIG. 2 is a cross-sectional view showing an example of the display device according to the first embodiment.
Figure 3:
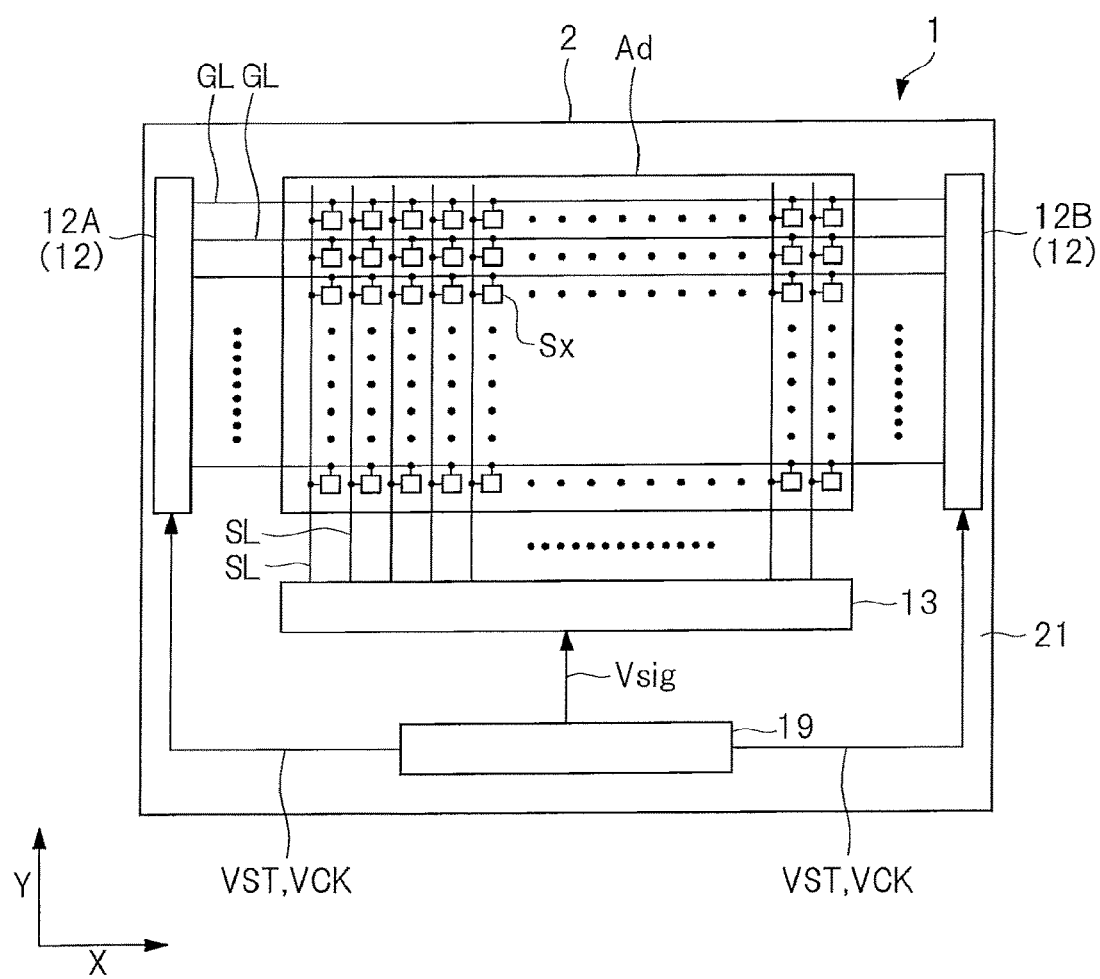
FIG. 3 is a circuit block diagram showing an example of the display device according to the first embodiment.
Figure 4:
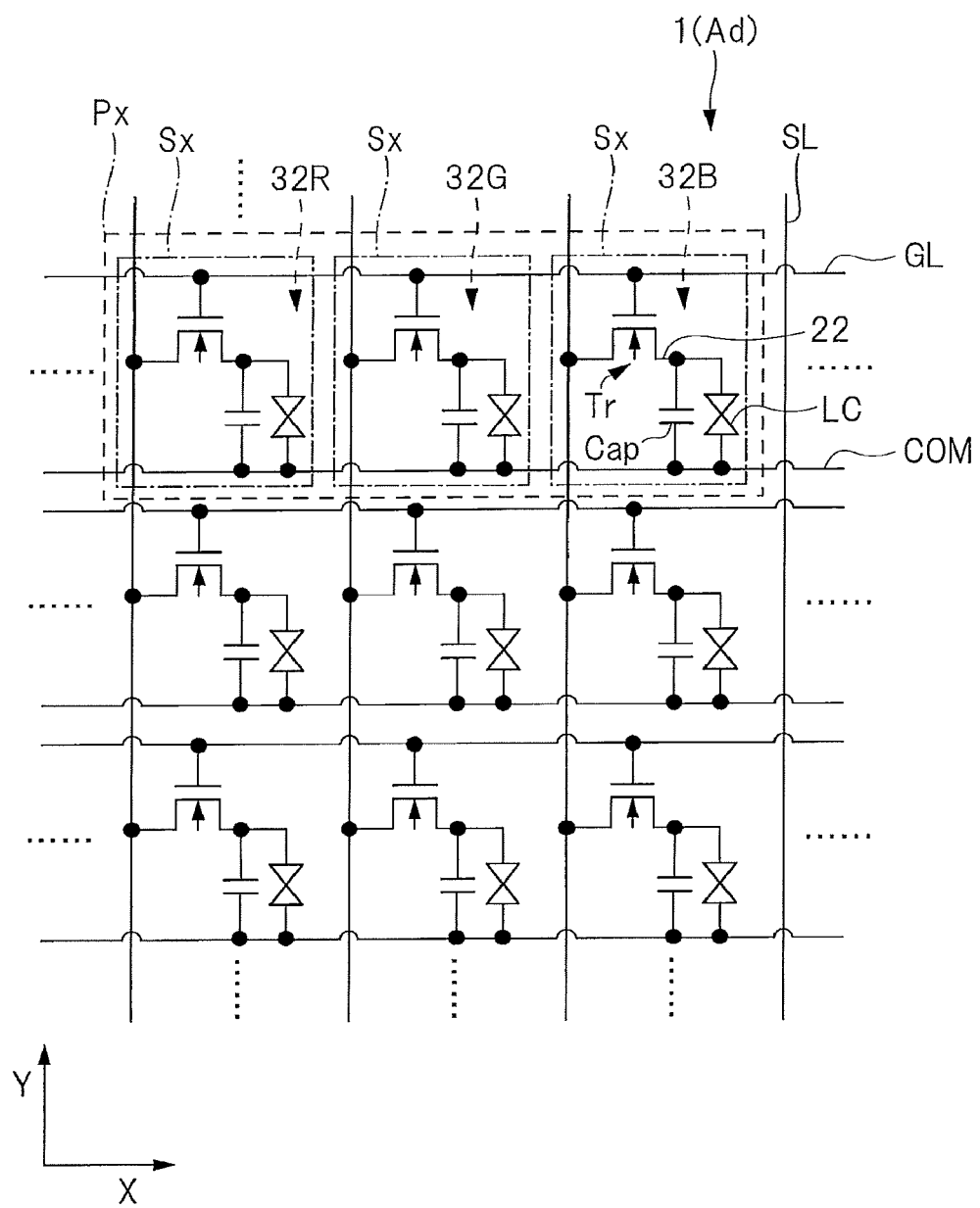
FIG. 4 is a circuit diagram showing an example of the display device according to the first embodiment.

Next, an example of the arrangement of the display device according to the present first embodiment will be described in detail with reference to FIGS. 1 and 2 to 4. FIG. 2 is a cross-sectional view showing an example of the display device according to the first embodiment. FIG. 3 is a circuit block diagram showing an example of the display device according to the first embodiment. FIG. 4 is a circuit diagram showing an example of the display device according to the first embodiment.

As shown in FIG. 2, the display device 1 (see FIG. 1) includes the array substrate 2 as the first substrate, the counter substrate 3 as the second substrate, and a liquid crystal layer 6. The counter substrate 3 is arranged to face the array substrate 2 so that an upper surface of the array substrate 2 faces a lower surface of the counter substrate 3.

The liquid crystal layer 6 is provided between the array substrate 2 and the counter substrate 3.

The array substrate 2 includes the insulating substrate 21. In addition, the counter substrate 3 includes the insulating substrate 31. The substrate 31 has an upper surface and a lower surface on the opposite side to the upper surface, and is arranged at such a position as facing the substrate 21 so that the upper surface of the substrate 21 faces the lower surface of the substrate 31. The liquid crystal layer 6 is sandwiched between the upper surface of the substrate 21 and the lower surface of the substrate 31. Note that the upper surface of the substrate 21 is called the upper surface 21a, as described above. In addition, the lower surface of the substrate 31 is called a lower surface 31a.

As shown in FIG. 3, the array substrate 2 has the display region Ad, the semiconductor chip 19, the gate drivers 12A and 12B, and the source driver 13 on the substrate 21.

As shown in FIGS. 3 and 4, the sub-pixels Sx are arranged in a matrix pattern in the display region Ad. As shown in FIG. 4, one pixel Px is formed by a plurality of sub-pixels Sx with different colors from one another.

In the specification of the present application, note that the term "row" indicates a pixel row having a plurality of sub-pixels Sx arranged in the X-axis direction as the first direction. In addition, the term "column" indicates a pixel column having a plurality of sub-pixels Sx arranged in the Y-axis direction as the second direction that intersects, preferably orthogonally crosses the direction of the row arrangement.

As shown in FIG. 3, in the display region Ad, each of a plurality of scanning lines GL extends in the X-axis direction and is arranged in the Y-axis direction. In the display region Ad, each of a plurality of signal lines SL extends in the Y-axis direction and is arranged in the X-axis direction. Accordingly, a plurality of signal lines SL intersect a plurality of scanning lines GL in plan view, respectively. As described above, in plan view, the sub-pixels Sx are arranged at the intersections between the plurality of scanning lines GL and the plurality of signal lines SL that intersect each other.

A master clock, a horizontal synchronization signal, and a vertical synchronization signal are input from outside of the array substrate 2 to the semiconductor chip 19. Based on the master clock, the horizontal synchronization signal, and the vertical synchronization signal input to the semiconductor chip 19, the semiconductor chip 19 generates a vertical start pulse VST and a vertical clock pulse VCK and supplies them to the gate drivers 12A and 12B.

The gate drivers 12A and 12B sequentially select the sub-pixels Sx for each row by sequentially outputting and supplying the scanning signals based on the input vertical start pulse VST and the input vertical clock pulse VCK to the scanning lines GL.

For example, red, green, and blue image signals Vsig are supplied to the source driver 13. The source driver 13 supplies a pixel signal to each sub-pixel Sx of a row selected by the gate drivers 12A and 12B via the signal line SL for each pixel or each group of a plurality of pixels.

As shown in FIG. 4, in plan view, the transistor Tr formed from a thin film transistor (TFT) as a field-effect transistor is formed in the sub-pixel region surrounded by the pair of scanning lines GL and the pair of signal lines SL. Accordingly, a plurality of transistors Tr are formed on the substrate 21 in the display region Ad. The plurality of transistors Tr are arranged in a matrix pattern in the X-axis direction and the Y-axis direction. That is, the transistor Tr is provided for each of the plurality of sub-pixels Sx. In addition to the transistor Tr, a pixel electrode 22 is provided for each of the plurality of sub-pixels Sx.

The transistor Tr is formed from a thin film transistor as, for example, an n-channel metal oxide semiconductor (MOS). The gate electrode of the transistor Tr is connected to the scanning line GL. One of the source electrode and drain electrode of the transistor Tr is connected to the signal line SL. The other of the source electrode and drain electrode of the transistor Tr is connected to the pixel electrode 22.

As shown in FIG. 2, the array substrate 2 includes the substrate 21, a common electrode COM, the insulating film IF, and the plurality of pixel electrodes 22. The common electrode COM is provided, for example, integrally with the upper surface 21a of the substrate 21 inside the display region Ad in plan view. The insulating film IF is formed on the upper surface 21a of the substrate 21 including the surface of the common electrode COM. In the display region Ad, the plurality of pixel electrodes 22 are formed on the insulating film IF. Accordingly, the insulating film IF electrically insulates the common electrode COM from the pixel electrodes 22.

As shown in FIG. 4, inside the display region Ad, the plurality of pixel electrodes 22 are formed inside the plurality of sub-pixels Sx arranged in a matrix pattern in the X-axis direction and the Y-axis direction in plan view, respectively. Accordingly, the plurality of pixel electrodes 22 are arranged in a matrix pattern in the X-axis direction and the Y-axis direction.

In the example shown in FIG. 2, the common electrode COM is formed between the substrate 21 and the pixel electrodes 22. In addition, the common electrode COM is provided to overlap each of the plurality of pixel electrodes 22, and overlaps the scanning lines GL in plan view. A voltage is applied between each of the plurality of pixel electrodes 22 and the common electrode COM to form an electric field between each of the plurality of pixel electrodes 22 and the common electrode COM, that is, an electric field in each of the plurality of sub-pixels Sx. In this manner, the liquid crystals in the liquid crystal layer 6 orient to display an image in the display region Ad. At this time, a capacitance Cap is formed between the common electrode COM and the pixel electrode 22. The capacitance Cap functions as a retention capacitance.

Note that the common electrode COM may be formed closer to the liquid crystal layer 6 than the pixel electrodes 22. The common electrode COM may be formed on the substrate 31. In addition, in the example shown in FIG. 2, the arrangement of the common electrode COM and the pixel electrodes 22 is an arrangement based on a fringe field switching (FFS) mode as a transverse electric field mode in which the common electrode COM overlaps the pixel electrodes 22 in plan view. The arrangement of the common electrode COM and the pixel electrodes 22 may be an arrangement based on an in plane switching (IPS) mode as a transverse electric field mode in which the common electrode COM does not overlap the pixel electrodes 22 in plan view. Alternatively, the arrangement of the common electrode COM and the pixel electrodes 22 may be an arrangement based on a twisted nematic (TN) mode, vertical alignment (VA) mode, or others as a longitudinal electric field mode.

The liquid crystal layer 6 modulates light that passes this layer in accordance with the state of the electric field. As the liquid crystal layer 6, a liquid crystal layer adapting to, for example, the transverse electric field mode such as the FFS mode or IPS mode described above, is used. Note that an orientation film may be formed between the liquid crystal layer 6 and the array substrate 2 and between the liquid crystal layer 6 and the counter substrate 3 shown in FIG. 2.

The gate drivers 12A and 12B sequentially select, as a display drive target, one row (one horizontal line) of the sub-pixels Sx arranged in a matrix pattern in the display region Ad by supplying the scanning signal via the scanning line GL to the gate of the transistor Tr of the sub-pixel Sx. The source driver 13 supplies the pixel signal via the signal line SL to each sub-pixel Sx included in one horizontal line sequentially selected by the gate drivers 12A and 12B. In these sub-pixels Sx, a display operation on one horizontal line is performed in accordance with the supplied pixel signals.

As shown in FIG. 2, the counter substrate 3 includes the substrate 31 and a color filter 32. The color filter 32 is formed on the lower surface 31a of the substrate 31.

As the color filter 32, color filters that are colored with, for example, three colors that are red (R), green (G), and blue (B) are arranged in the X-axis direction. In this manner, as shown in FIG. 4, a plurality of sub-pixels Sx corresponding to color regions 32R, 32G, and 32B with the three colors that are red, green, and blue, are formed, respectively, and one pixel Px is formed by a plurality of sub-pixels Sx corresponding to the color regions 32R, 32G, and 32B, as one group, respectively. The sub-pixels Sx corresponding to the respective colors that are red, green, and blue, display the respective colors that are red, green, and blue.

As a color combination of the color filter 32, a plurality of colors including a color other than red, green, and blue may be combined. In addition, one pixel Px may include the sub-pixel Sx that is not provided with the color filter 32, that is, the sub-pixel Sx of white (W) that displays white. Alternatively, a color filter may be provided on the array substrate 2 by a color filter on array (COA) technique.

Note that a polarizing plate (not shown) may be provided below the array substrate 2, and a polarizing plate (not shown) may be provided above the counter substrate 3.

<Parasitic Capacitance>

Figure 5:
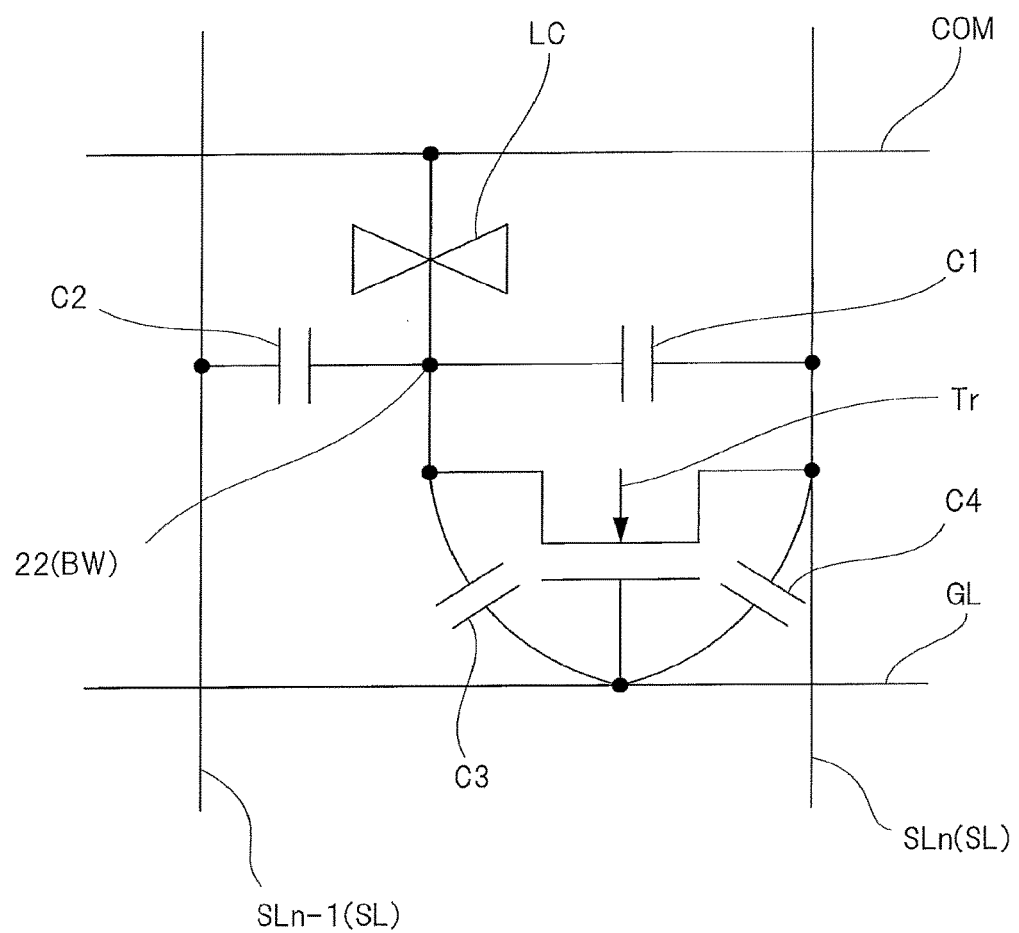
FIG. 5 is an equivalent circuit diagram showing an example of arrangement of a pixel in the display device according to the first embodiment.
Figure 6:
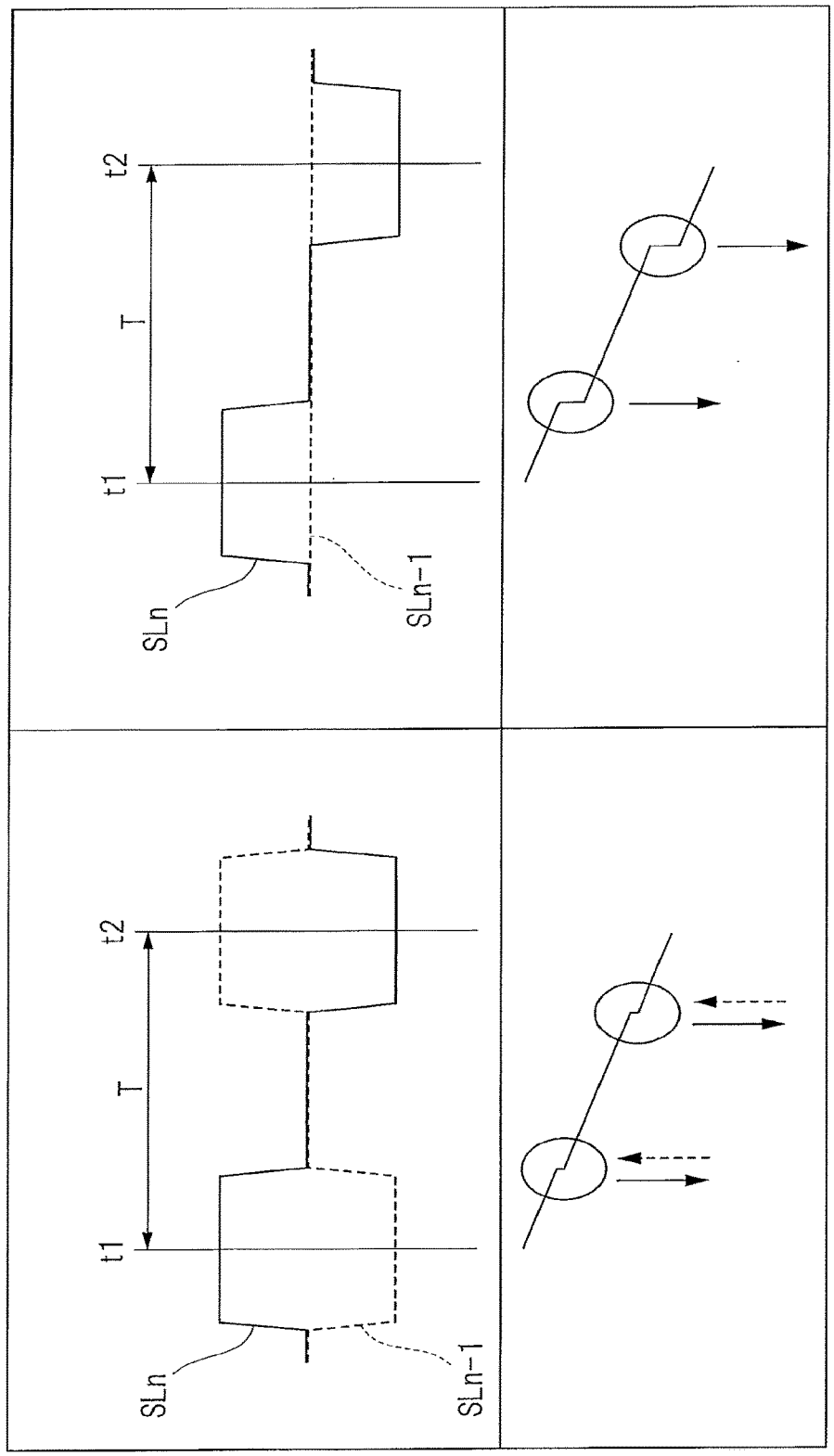
FIG. 6A is a view showing an example of white raster display in the display device according to the first embodiment.
FIG. 6B is a view showing an example of green raster display in the display device according to the first embodiment.

Next, a parasitic capacitance in the display device according to the first embodiment will be described with reference to FIGS. 5 to 6B. FIG. 5 is an equivalent circuit diagram showing an example of arrangement of a pixel in the display device according to the first embodiment. FIGS. 6A and 6B are explanatory diagrams each showing an example of white raster display and an example of green raster display in the display device according to the first embodiment.

As shown in FIG. 5, each sub-pixel Sx in the display device includes the transistor Tr formed from a TFT. The gate electrode of the transistor Tr is connected to the scanning line GL. One of the source electrode and drain electrode of the transistor Tr is connected to the signal line SL. The other of the source electrode and drain electrode of the transistor Tr is connected to the pixel electrode 22 via a base electrode BW. A liquid crystal element LC is interposed between the pixel electrode 22 (the base electrode BW) and the common electrode COM.

In such arrangement of the pixel Px, a parasitic capacitance C1 acts between a signal line SLn of the pixel itself and the base electrode BW. In addition, a parasitic capacitance C2 acts between the base electrode BW and a different signal line SLn−1 adjacent to the signal line SLn of the pixel itself. Furthermore, a parasitic capacitance C3 acts between the scanning line GL and the base electrode BW. A parasitic capacitance C4 acts between the scanning line GL and the signal line SLn of the pixel itself.

FIG. 6A shows white raster display that causes all the sub-pixels Sx of red (R), green (G), and blue (B) to emit light, and FIG. 6B shows green raster display that causes only the sub-pixel Sx of green (G) to emit light. A one line column inversion driving scheme under alternate-current voltage driving will be exemplified below. This driving scheme is a driving scheme that alternately inverts the sub-pixels Sx on a column (in the column direction) between positive and negative polarities for each line.

In each of FIGS. 6A and 6B, an upper part shows time-series changes in potentials of video signals applied to the signal line SLn and the adjacent signal line SLn−1, and a lower part shows changes in the potential applied from the signal line SLn to the pixel electrode of the sub-pixel Sx in the same time series as that in the upper part. The potential change is proportional to change in the luminance of the sub-pixel Sx. The potential applied to the sub-pixel Sx gradually decreases in a period "T" due to a current leakage or others.

As shown in FIG. 6A, in the white raster display, a driving signal sequentially repeatedly changing among a positive polarity potential, a ground potential, a negative polarity potential, and a ground potential is applied to the signal line SLn of the pixel itself. In this case, a driving signal and sequentially repeatedly changing among a negative polarity potential, a ground potential, a positive polarity potential, and a ground potential, each of which has an inverted polarity, is applied to the adjacent different signal line SLn−1. That is, at a certain timing "t1" in the period T, a driving signal with the positive polarity potential is applied to the signal line SLn of the pixel itself, and a driving signal with the negative polarity potential which has the inverted polarity is applied to the adjacent different signal line SLn−1. At a next timing "t2", a driving signal with the negative polarity potential having been inverted is applied to the signal line SLn of the pixel itself, and a driving signal with the positive polarity potential which has an opposite polarity having been inverted is applied to the adjacent different signal line SLn−1.

In this case, the potential of the sub-pixel Sx decreases as the time change from the timing t1 to the timing t2, and a large stepwise potential change that causes flicker occurs at the timings when each potential applied to the signal lines SLn and SLn−1 switches (see each portion circled in the lower part of FIGS. 6A and 6B). These potential changes are related to the potential applied to the signal line SLn of the pixel itself and the potential applied to adjacent different signal line SLn−1. More specifically, the potential changes are influenced by the coupling between the parasitic capacitance C1 acting between the signal line SLn of the pixel itself and the base electrode BW and the parasitic capacitance C2 acting between the adjacent different signal line SLn−1 and the base electrode BW. However, in the case of the white raster display shown in FIG. 6A, the parasitic capacitance C1 and the parasitic capacitance C2 act in directions to cancel each other because the polarities of the voltages applied to the signal lines SLn and SLn−1 are different from each other, and therefore, the stepwise potential changes are relatively small.

On the other hand, as shown in FIG. 6B, in the case of the green raster display, the driving signal sequentially repeatedly changing among the positive polarity potential, the ground potential, the negative polarity potential, and the ground potential is applied to the signal line SLn of the pixel itself. In this case, a driving signal fixed to the ground potential is applied to the adjacent different signal line SLn−1. That is, at the timing t1 in the period T, a driving signal with the positive polarity potential is applied to the signal line SLn of the pixel itself, and a driving signal with the ground potential is applied to the adjacent different signal line SLn−1. At the next timing t2, a driving signal with the negative polarity potential having been inverted is applied to the signal line SLn of the pixel itself, and a driving signal with the ground potential is applied to the adjacent different signal line SLn−1.

In this case, the potential of the sub-pixel Sx decreases as the time change from the timing t1 to the timing t2, and a large stepwise potential change that causes flicker occurs at the timings when each potential applied to the signal lines SLn and SLn−1 switches. This potential change is much larger than that in the case of the white raster display because of not having the parasitic capacitance C2 as a cancellation factor and relating to only the potential applied to the signal line SLn of the pixel itself. That is, in the case of the green raster display shown in FIG. 6B, the above-described change is influenced by the coupling of only the parasitic capacitance C1 acting between the signal line SLn of the pixel itself and the base electrode BW.

When the case of the white raster display shown in FIG. 6A and the case of the green raster display shown in FIG. 6B are compared with each other here, difference in the luminance change corresponds to the parasitic capacitance C2 acting on the adjacent different signal line SLn−1. In addition, the luminance in the case of the green raster display is changed by the parasitic capacitance C1 acting on the signal line SLn of the pixel itself. Therefore, in order to improve the flicker deterioration in the case of the green raster display, it is necessary to reduce the parasitic capacitance C1 acting on the signal line SLn of the pixel itself.

In recent years, the number of pixels in the display device increases because high resolution is required, and therefore, the number of wirings (the signal lines SL and the scanning lines GL) proportionally increases. Thus, an internal area of the sub-pixel Sx reduces, and a distance between the signal line SL and each constituent element in the sub-pixel Sx reduces, which results in increase in the parasitic capacitance, and therefore, there is a problem of deterioration in the image quality. Accordingly, the present embodiment has been made to improve the image quality by reducing the parasitic capacitance C1 acting between the signal line SLn of the pixel itself and the base electrode BW. This image quality is influenced by, for example, the flicker recognized as the flickering by the human eye. Such influence on the image quality becomes more significant in a case of low-frequency (for example, 60 Hz) driving. For this reason, the present embodiment is suitable for a display device required to achieve the low-frequency driving in addition to the high resolution.

<Arrangement of Pixel>

Figure 7:
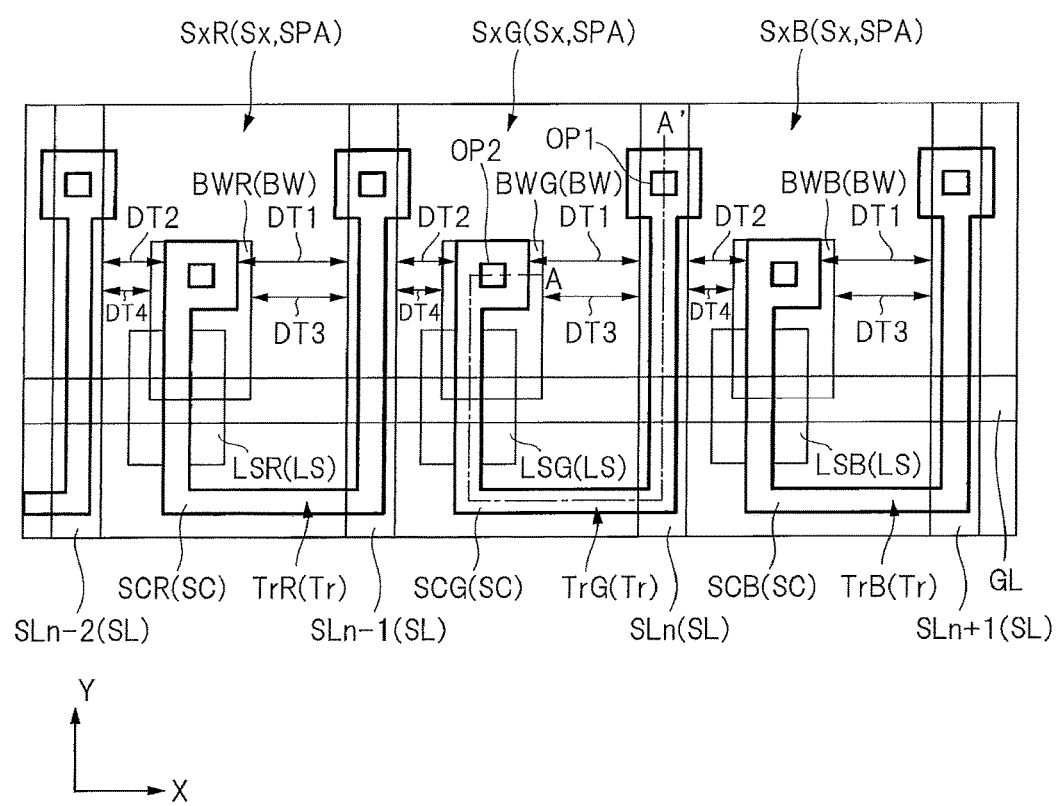
FIG. 7 is a plan view showing an example of arrangement of a pixel in the display device according to the first embodiment.

The arrangement of the pixel in the display device according to the first embodiment will be described with reference to FIGS. 7 and 8. FIG. 7 is a plan view showing an example of the arrangement of the pixel in the display device according to the first embodiment. FIG. 8 is a cross-sectional view taken along a line A-A' of FIG. 7.

As described above, the pixel Px includes the three sub-pixels Sx that display the respective three colors that are red, green, and blue. Alternatively, as described above, the pixel Px may include the four sub-pixels Sx displaying the respective four colors that red, green, blue, and white. The sub-pixel Sx of each color is formed on the substrate 21, that is, the array substrate 2.

As shown in FIGS. 7 and 8, each of the plurality of sub-pixels Sx includes a sub-pixel region SPA, the base electrode BW (BWR, BWG, or BWB), and the transistor Tr (TrR, TrG, or TrB). Although not shown in FIGS. 7 and 8, each of the plurality of sub-pixels Sx includes the pixel electrode 22. The transistor Tr includes the scanning line GL as a gate electrode, an insulating film IF1 as a gate insulating film, a semiconductor layer SC (SCR, SCG, or SCB), the signal line SL as one of a source electrode and a drain electrode, and the base electrode BW as the other of the source electrode and the drain electrode.

The example shown in FIG. 7 shows the red sub-pixel SxR, the green sub-pixel SxG, and the blue sub-pixel SxB in the X-axis direction. The green sub-pixel SxG is arranged next to the red sub-pixel SxR, and the blue sub-pixel SxB is arranged next to the green sub-pixel SxG.

In each sub-pixel Sx, the transistor Tr is provided in the sub-pixel region SPA and driven by the scanning line GL and the signal line SL. In each sub-pixel Sx, the base electrode BW is provided in the sub-pixel region SPA. Although not shown, the pixel electrode 22 is also provided in the sub-pixel region SPA. A video signal supplied from the signal line SL is applied to the pixel electrode 22 via the transistor Tr. The pixel electrode 22 is formed in an upper layer via an organic insulating layer than a layer on which the signal line SL and the base electrode BW are formed. For this reason, the pixel electrode 22 is electrically connected to the base electrode BW via a contact hole formed in the organic insulating film. Thus, the pixel electrode 22 obtains a video signal from the signal line SL via the base electrode BW.

As shown in FIG. 8, the array substrate 2 includes the substrate 21. A light shielding film LS is formed on the upper surface 21a of the substrate 21. The light shielding film LS is made of, for example, a resin or a metal and has a light shielding property. The light shielding film LS is formed at a position to face the scanning line GL.

The light shielding film LS is covered with the insulating film IF1. The insulating film IF1 is made of an inorganic insulating material such as silicon nitride (SiN) or silicon oxide ($SiO_2$).

The semiconductor layer SC is formed on the insulating film IF1. The semiconductor layer SC is made of, for example, a low-temperature polysilicon or amorphous silicon. Alternatively, a transparent oxide semiconductor typified by a zinc-based oxide such as indium zinc oxide (IZO) or indium gallium zinc oxide (IGZO) may be used.

An insulating film IF2 is formed on the semiconductor layer SC. The insulating film IF2 is made of an inorganic insulating material such as silicon nitride (SiN) or silicon oxide ($SiO_2$) and is an insulating film serving as a gate insulating film.

The scanning line GL is formed on the insulating film IF2. The scanning line GL is made of a metal such as molybdenum (Mo) or aluminum (Al).

The scanning line GL is covered with an insulating film IF3. The insulating film IF3 is made of an inorganic insulating material such as silicon nitride (SiN) or silicon oxide ($SiO_2$).

Opening portions OP1 and OP2 are formed in the insulating film IF3 so as to extend through the insulating films IF3 and IF2 and reach the semiconductor layer SC.

The base electrode BW is formed inside the opening portion OP2 and on the insulating films IF2 and IF3 and is electrically connected to the semiconductor layer SC via the opening portion OP2. The base electrode BW is made of a metal such as aluminum (Al).

The signal line SL is formed inside the opening portion OP1 and on the insulating films IF2 and IF3 and is electrically connected to the semiconductor layer SC via the opening portion OP1. The signal line SL is made of a metal such as aluminum (Al).

In this manner, the semiconductor layer SC, the signal line SL, and the scanning line GL are formed on the different layers from one another in the direction perpendicular to the upper surface 21a of the substrate 21. In addition, the signal line SL and the base electrode BW are formed on the same layer as each other in the direction perpendicular to the upper surface 21a of the substrate 21.

The scanning line GL stereoscopically intersects a part of the semiconductor layer SC, and functions as the gate electrode of the transistor Tr. The signal line SL is connected to the semiconductor layer SC via the opening portion OP1, and functions as, for example, the source electrode of the transistor Tr. In addition, the base electrode BW is connected to the semiconductor layer SC via the opening portion OP2, and functions as, for example, the drain electrode of the transistor Tr. Alternatively, when the signal line SL functions as, for example, the drain electrode of the transistor Tr, the base electrode BW functions as the source electrode of the transistor Tr.

Although not shown, the common electrode COM is formed in a layer upper than the signal line SL and the base electrode BW via an insulating film. The common electrode COM is a transparent electrode made of a transparent conductive material such as indium tin oxide (ITO), that is, a transparent conductive oxide. The pixel electrode 22 connected to the base electrode BW via an opening portion of the insulating film is formed in a layer upper than the common electrode COM. The pixel electrode 22 is a transparent electrode made of a transparent conductive material such as ITO. An orientation film made of, for example, polyimide is formed in a layer upper than the pixel electrode 22.

The parasitic capacitance C1 shown in FIG. 8 is formed between the base electrode BW and the signal line SLn. In plan view of FIG. 7, the parasitic capacitance C1 corresponds to a distance DT3 between the base electrode BW and the signal line SLn, which are adjacent to each other.

The parasitic capacitance C2 shown in FIG. 8 is formed between the base electrode BW and the signal line SLn−1 not shown. In plan view of FIG. 7, the parasitic capacitance C2 corresponds to a distance DT4 between the base electrode BW and the signal line SLn−1, which are adjacent to each other.

The parasitic capacitance C3 shown in FIG. 8 is formed between the base electrode BW and the scanning line GL. In plan view of FIG. 7, the parasitic capacitance C3 corresponds to an overlapping region between the base electrode BW and the scanning line GL.

The parasitic capacitance C4 shown in FIG. 8 is formed between the signal line SLn and the scanning line GL. In plan view of FIG. 7, the parasitic capacitance C4 corresponds to the overlapping region between the signal line SLn and the scanning line GL.

<Arrangement of Signal Line and Semiconductor Layer of Transistor>

Figure 23:
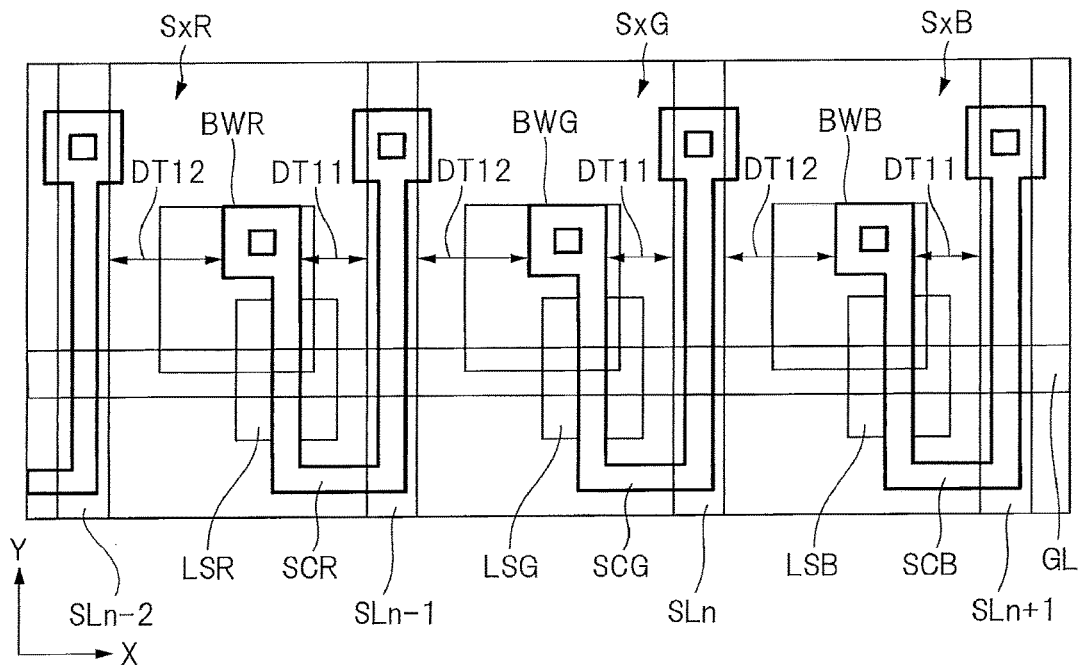
FIG. 23 is a plan view showing an example of arrangement of a pixel according to a comparative example of the first embodiment.

The arrangement of the signal line and the semiconductor layer of transistor in the display device according to the present first embodiment will be described with reference to FIG. 7 described above. FIG. 23 will be exemplified as a comparative example of the present first embodiment. FIG. 23 is a plan view showing an example of the arrangement of the pixel in a comparative example of the first embodiment.

On the insulating substrate 21 of the array substrate 2, the display device according to the present first embodiment includes the plurality of scanning lines GL, the plurality of signal lines SL, and the plurality of transistors Tr formed in the sub-pixel regions SPA at which the plurality of scanning lines GL and the plurality of signal lines SL intersect each other. As shown in FIG. 7, in plan view, the plurality of scanning lines GL extend in the first direction and are arranged in the second direction intersecting the first direction. In plan view, the plurality of signal lines SL (SLn−2, SLn−1, SLn, and SLn+1) extend in the second direction and are arrange in the first direction. In plan view, the plurality of sub-pixel regions SPA are regions each surrounded by the two adjacent scanning lines GL and the two adjacent signal lines SL.

Each of the plurality of transistors includes the semiconductor layer SC and the base electrode BW as a metal layer electrically connected to the semiconductor layer SC. FIG. 7 shows an arrangement case of the transistor TrR for a red sub-pixel, the transistor TrG for a green sub-pixel, and the transistor TrB for a blue sub-pixel in this order from the left side. The transistor TrR for the red sub-pixel includes a semiconductor layer SCR and a base electrode BWR. The transistor TrG for the green sub-pixel includes a semiconductor layer SCG and a base electrode BWG. The transistor TrB for the blue sub-pixel includes a semiconductor layer SCB and a base electrode BWB. FIG. 7 also shows light shielding films LSR, LSG, and LSB corresponding to the transistors TrR, TrG, and TrB, respectively.

The first transistor of the plurality of transistors, e.g., the transistor TrG, is connected to a signal line SLn of the plurality of signal lines SL, e.g., the first signal line. The transistor TrG includes the semiconductor layer SCG as the first semiconductor layer and the base electrode BWG as the first base electrode. One end of the semiconductor layer SCG is electrically connected to the signal line SLn. The other end of the semiconductor layer SCG is electrically connected to the base electrode BWG. In FIG. 7, the transistor TrG is a transistor for a green sub-pixel which is arranged in the middle.

The second transistor of the plurality of transistors, e.g., the transistor TrR, is connected to a signal line SLn−1, e.g., the second signal line adjacent to the signal line SLn that is the first signal line. As similar to the transistor TrG, the transistor TrR also includes the semiconductor layer SCR as the second semiconductor layer and the base electrode BWR as the second base electrode. One end of the semiconductor layer SCR is electrically connected to the signal line SLn−1. The other end of the semiconductor layer SCR is electrically connected to the base electrode BWR. In FIG. 7, the transistor TrR is a transistor for a red sub-pixel which is arranged on the left end.

As similar to the transistor TrG, the third transistor of the same, e.g., the transistor TrB, also includes the semiconductor layer SCB and the base electrode BWB. One end of the semiconductor layer SCB is electrically connected to the signal line SLn+1. The other end of the semiconductor layer SCB is electrically connected to the base electrode BWB. In FIG. 7, the transistor TrB is a transistor for a blue sub-pixel which is arranged on the right end.

When attention is paid to the transistor TrG for the green sub-pixel (the first transistor) in the display device according to the first embodiment, as shown in FIG. 7, a distance DT1 between the signal line SLn (the first signal line) and the semiconductor layer SCG (the first semiconductor layer) is larger than a distance DT2 between the signal line SLn−1 (the second signal line) and the semiconductor layer SCG (the first semiconductor layer) in plan view. The distances DT1 and DT2 are distances in the X-axis direction (the first direction) in FIG. 7. On the other hand, in the comparative example of the present first embodiment, as shown in FIG. 23, a distance DT11 between the signal line SLn and the semiconductor layer SCG is shorter than a distance DT12 between the signal line SLn−1 and the semiconductor layer SCG in plan view.

When the present first embodiment and the comparative example of the first embodiment are compared with each other, in the present first embodiment, the semiconductor layer SCG is at a farther position from the signal line SLn of the pixel itself. For this reason, the base electrode BWG in the present first embodiment can be formed closer to the signal line SLn−1 as a whole. Therefore, in plan view, the distance DT3 between the signal line SLn (the first signal line) and the base electrode BWG is larger than a distance DT4 between the signal line SLn−1 (the second signal line) and the base electrode BWG. Therefore, the parasitic capacitance C1 (see FIGS. 5 and 8) acting between the signal line SLn of the pixel itself and the base electrode BW becomes smaller as the distance between the signal line SLn of the pixel itself and the semiconductor layer SCG becomes larger, and therefore, the parasitic capacitance C1 in the present first embodiment can become smaller than that in the comparative example.

More specifically, in the semiconductor layer SCG in the display device according to the present first embodiment, one end of the semiconductor layer SCG is electrically connected to the signal line SLn via the opening portion OP1, and the semiconductor layer SCG extends along the signal line SLn. A portion of the semiconductor layer SCG which extends along the signal line SLn overlaps the signal line SLn, and the semiconductor layer SCG intersects the scanning line GL at this portion. The portion extending along the signal line SLn has the same length as that in the comparative example.

Further, in the display device according to the present first embodiment, the semiconductor layer SCG bends from the extending direction of the signal line SLn and extends along the extending direction of the scanning line GL. The portion extending along the extending direction of the scanning line GL is longer than that in the comparative example, and leads to reduction in the parasitic capacitance C1 acting between the signal line SLn of the pixel itself and the base electrode BW.

Still further, in the display device according to the present first embodiment, the semiconductor layer SCG bends from the extending direction of the scanning line GL and extends along the extending direction of the signal line SLn, and the other end of the semiconductor layer SCG is electrically connected to the base electrode BWG via the opening portion OP2. A portion of the semiconductor layer SCG which extends along the extending direction of the signal line SLn intersects the scanning line GL, and a light shielding film LSG is arranged in this intersecting region. The portion extending along the extending direction of the signal line SLn has the same length as that in the comparative example.

In the display device according to the present first embodiment, one end and the other end of the semiconductor layer SCG have rectangular shapes having the opening portions OP1 and OP2 in plan view, respectively. The other end of the semiconductor layer SCG is formed to protrude toward the signal line SLn of the pixel itself in contrast to the comparative example. The base electrode BWG has a rectangular shape in plan view. A part of the base electrode BWG overlaps the scanning line GL.

In the above description, the case focusing on the transistor TrG for the green sub-pixel as the first transistor has been described. The display device according to the present first embodiment is not limited to this, and the same applies to the transistor TrR for the red sub-pixel and the transistor TrB for the blue sub-pixel.

That is, when attention is paid to the transistor TrR for the red sub-pixel, as shown in FIG. 7, the distance DT1 between the signal line SLn−1 (the first signal line) and the semiconductor layer SCR (the first semiconductor layer) is larger than the distance DT2 between the signal line SLn−2 (the second signal line) and the semiconductor layer SCR (the first semiconductor layer) in plan view. Therefore, the distance DT3 between the base electrode BWR and the signal line SLn−1 can be larger than the distance DT4 between the base electrode BWR and the signal line SLn−2.

When attention is paid to the transistor TrB for the blue sub-pixel, as shown in FIG. 7, the distance DT1 between the signal line SLn+1 (the first signal line) and the semiconductor layer SCB (the first semiconductor layer) is larger than the distance DT2 between the signal line SLn (the second signal line) and the semiconductor layer SCB (the first semiconductor layer) in plan view. Therefore, the distance DT3 between the base electrode BWB and the signal line SLn+1 can be larger than the distance DT4 between the base electrode BWB and the signal line SLn.

In the display device according to the present first embodiment described above, the distance DT1 between the first signal line and the first semiconductor layer is made larger than the distance DT2 between the second signal line and the first semiconductor layer, so that the parasitic capacitance C1 acting between the first signal line SL of the pixel itself and the base electrode BW can be made small.

When the parasitic capacitance C1 decreases, note that the parasitic capacitance C2 conversely increases. However, the white raster display is influenced by the total coupling of the parasitic capacitances C1 and C2, and hence, the influence of the small parasitic capacitance on the white raster display is small.

As a result, the occurrence of flicker can be suppressed in both of monochrome raster display and the white raster display.

Second Embodiment

The arrangement of the pixel in the display device according to the second embodiment will be described. FIG. 9 is a plan view showing an example of the arrangement of the pixel in the display device according to the second embodiment. In the present embodiment, differences from the first embodiment described above will be mainly described.

As similar to the first embodiment described above, in the display device according to the second embodiment, a distance DT1 between the first signal line and the first semiconductor layer is larger than a distance DT2 between the second signal line and the first signal line. In the display device according to the present second embodiment, as shown in FIG. 9, a first base electrode BW (BWR, BWG, or BWB) as a metal layer has a notched portion (a concave portion) NT to be close to the first signal line SL (SLn−1, SLn, or SLn+1). In plan view, a distance DT3 between the first signal line SL and the notched portion NT of the first base electrode BW is larger than a distance DT4 between the second signal line SL and the first base electrode BW. The distances DT3 and DT4 are distances in the X-axis direction in FIG. 9. In this manner, the parasitic capacitance C1 acting between the first signal line SL of the pixel itself and the first base electrode BW can be made smaller.

FIG. 9 shows an example in which the notched portion NT of the first base electrode BW is formed at a right upper corner portion of the rectangular shape. However, the notched portion NT may be formed not only at the corner portion but formed into a shape obtained by notching an entire right side including a right upper corner portion and a right lower corner portion of the rectangular shape.

In the display device according to the present second embodiment, the distance DT3 between the first signal line SL and the first base electrode BW is made further larger than the distance DT4 between the second signal line SL and the first base electrode BW than that in the first embodiment described above, so that the parasitic capacitance C1 acting between the first signal line SL of the pixel itself and the first base electrode BW can further decreases, so that the image quality can be improved.

<Modification>

Figure 10:
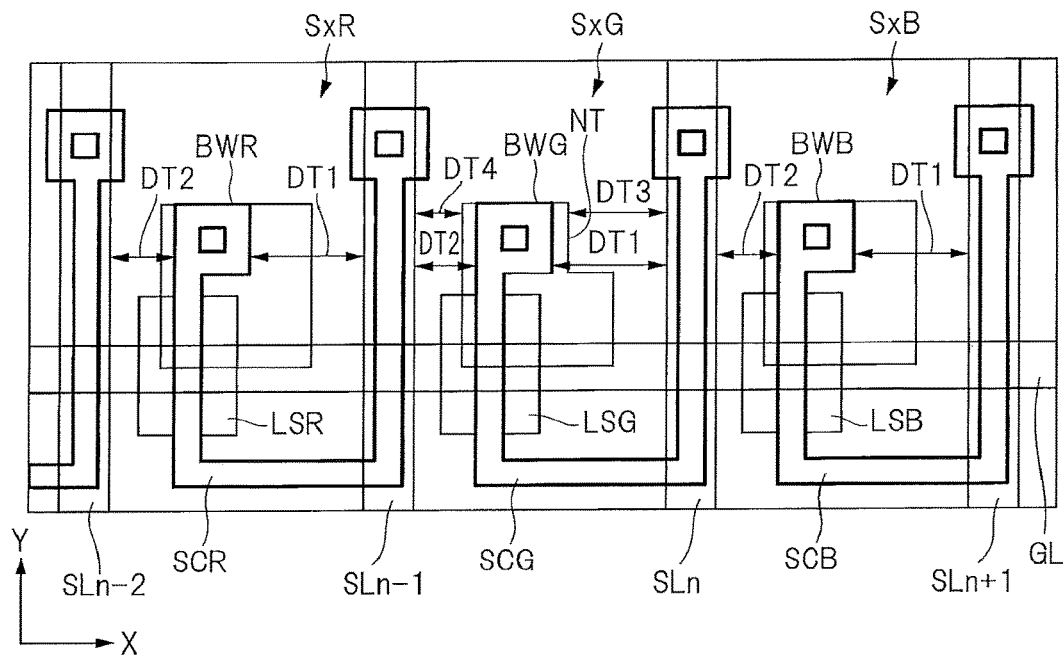
FIG. 10 is a plan view showing an example of arrangement of a pixel in a display device according to a modification example of the second embodiment.

Next, a modification example of the second embodiment will be described. FIG. 10 is a plan view showing an example of arrangement of a pixel in a display device according to the modification example of the second embodiment.

In the display device according to the modification example of the second embodiment, as shown in FIG. 10, the arrangement in which the distance DT3 between the first signal line SL and the notched portion NT of the first base electrode BW is made larger than the distance DT4 between the second signal line SL and the first base electrode BW is applied to the transistor TrG for the green sub-pixel. Each corresponding portion of the transistors TrR and TrB for the red and blue sub-pixels other than the transistor TrG for the green sub-pixel is the same as that shown in FIG. 7 in the first embodiment described above.

A reason why the above-described arrangement is applied to the transistor TrG for the green sub-pixel is as follows. In general, the human eye tends to recognize a luminance of a green color region more than luminance of red and blue color regions. Therefore, it is desirable to further reduce the parasitic capacitance of each green sub-pixel which greatly influences the flicker in order to improve an overall image luminance to be displayed and optimize white balance.

Even in the application to the transistor TrG for the green sub-pixel as described in the display device according to the modification example of the second embodiment, the parasitic capacitance C1 acting between the first signal line SL of the pixel itself and the first base electrode BW can be reduced in the transistor TrG for the green sub-pixel, and therefore, the image quality can be improved.

Third Embodiment

Figure 11:
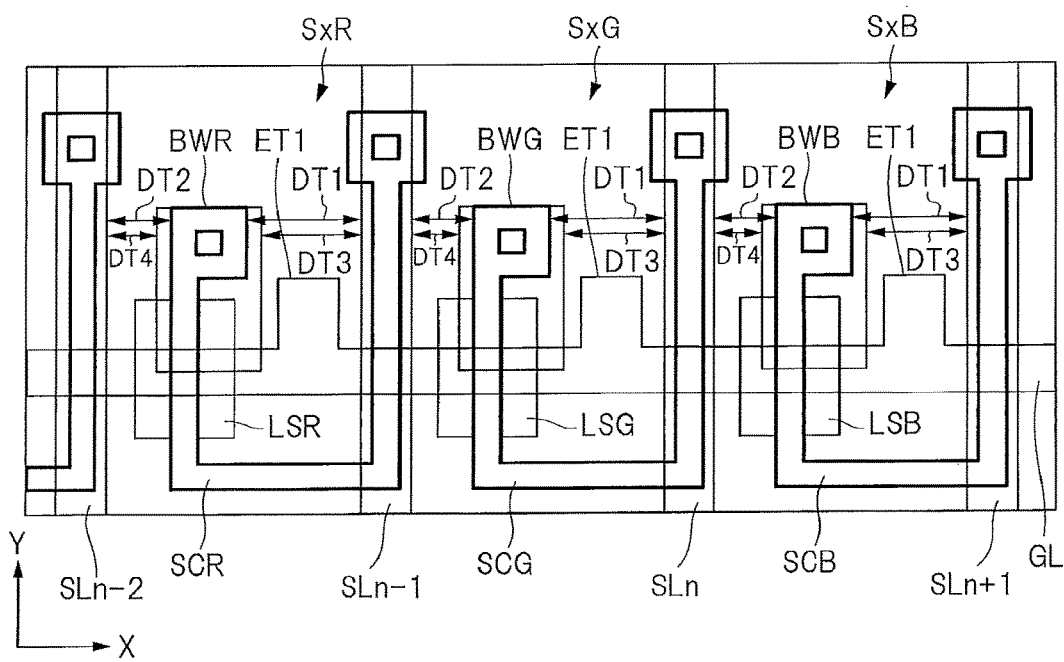
FIG. 11 is a plan view showing an example of arrangement of a pixel in a display device according to a third embodiment.

Arrangement of a pixel in a display device according to a third embodiment will be described. FIG. 11 is a plan view showing an example of the arrangement of the pixel in the display device according to the third embodiment. The present embodiment will mainly describe differences from the first and second embodiments described above.

As similar to the first embodiment described above, in the display device according to the present third embodiment, a distance DT1 between the first signal line and the first semiconductor layer is made larger than a distance DT2 between the second signal line and the first semiconductor layer. In addition, as shown in FIG. 11, in the display device according to the present third embodiment, a scanning line GL has a first extended portion ET1. In plan view, the first extended portion ET1 of the scanning line GL overlaps a first base electrode BW serving as a metal layer. In this manner, a parasitic capacitance C3 acting between the scanning line GL and the first base electrode BW can be further smaller than the parasitic capacitance C1 acting between the first signal line SL of the pixel itself and the first base electrode BW.

FIG. 11 shows an example in which the first extended portion ET1 protrudes and extends from the scanning line GL in the Y-axis direction. However, the first extended portion ET1 is not limited to this, and the first extended portion ET1 and the first base electrode BW may be formed so as to overlap each other.

In the display device according to the present third embodiment, the first extended portion ET1 of the scanning line GL and the first base electrode BW are formed to overlap each other more than the case in the first embodiment described above, so that the parasitic capacitance C1 acting between the first signal line SL of the pixel itself and the first base electrode BW can be smaller, and the image quality can be improved.

Modification Example

Figure 12:
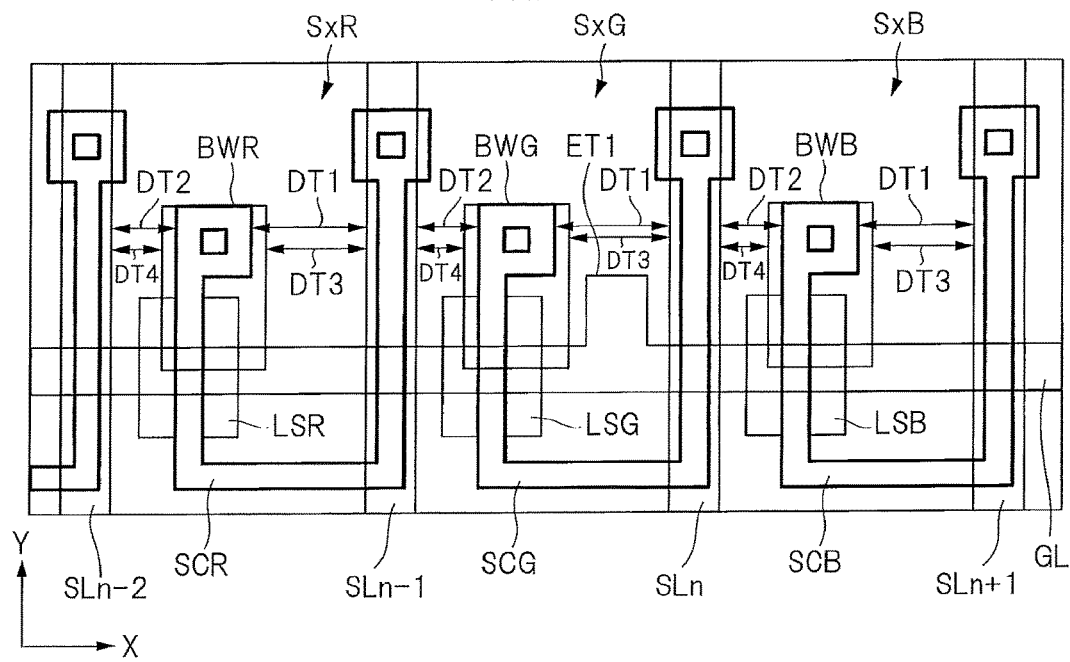
FIG. 12 is a plan view showing an example of arrangement of a pixel in a display device according to a modification example of the third embodiment.

Next, a modification example of the third embodiment will be described. FIG. 12 is a plan view showing an example of arrangement of a pixel in a display device according to a modification example of the third embodiment.

As shown in FIG. 12, in the display device according to the modification example of the third embodiment, the arrangement of the overlapping between the first extended portion ET1 of the scanning line GL and the first base electrode BW is applied to the transistor TrG for the green sub-pixel. Each corresponding portion of the transistors TrR and TrB for the red and blue sub-pixels other than the transistor TrG for the green sub-pixel is the same as that shown in FIG. 7 in the first embodiment described above.

Even in the application to the transistor TrG for the green sub-pixel as described in the display device according to the modification example of the third embodiment, the parasitic capacitance C1 acting between the first signal line SL of the pixel itself and the first base electrode BW can be reduced in the transistor TrG for the green sub-pixel, and therefore, the image quality can be improved.

Fourth Embodiment

Figure 13:
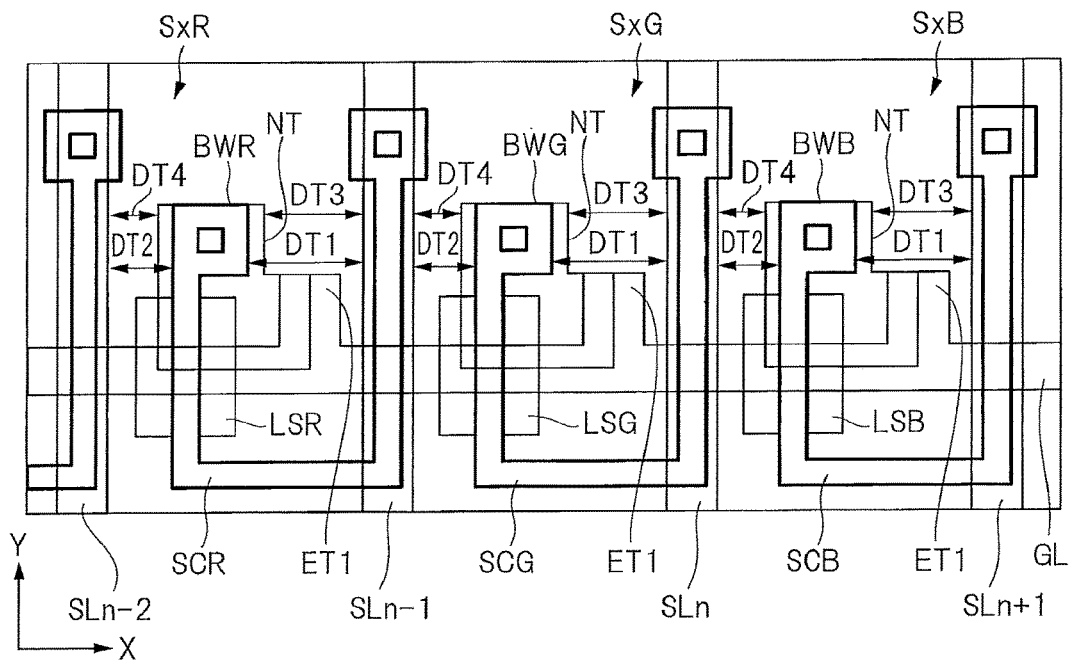
FIG. 13 is a plan view showing an example of arrangement of a pixel in a display device according to a fourth embodiment.

Arrangement of a pixel in a display device according to a fourth embodiment will be described. FIG. 13 is a plan view showing an example of the arrangement of the pixel in the display device according to the fourth embodiment. The present embodiment will mainly describe differences from the first to third embodiments described above.

The display device according to the fourth embodiment is an example of combining the second embodiment and the third embodiment. That is, in the display device according to the present fourth embodiment, as shown in FIG. 13, a first base electrode BW serving as a metal layer has a notched portion NT at a part closer to the first signal line SL. In plan view, a distance DT3 between the first signal line SL and the notched portion NT of the first base electrode BW is larger than a distance DT4 between a second signal line SL and the first base electrode BW. In addition, a scanning line GL has a first extended portion ET1. In plan view, the first extended portion ET1 of the scanning line GL overlaps the first base electrode BW.

The display device according to the present fourth embodiment can obtain the same effects as those of the second and third embodiments described above.

Modification Example

Figure 14:
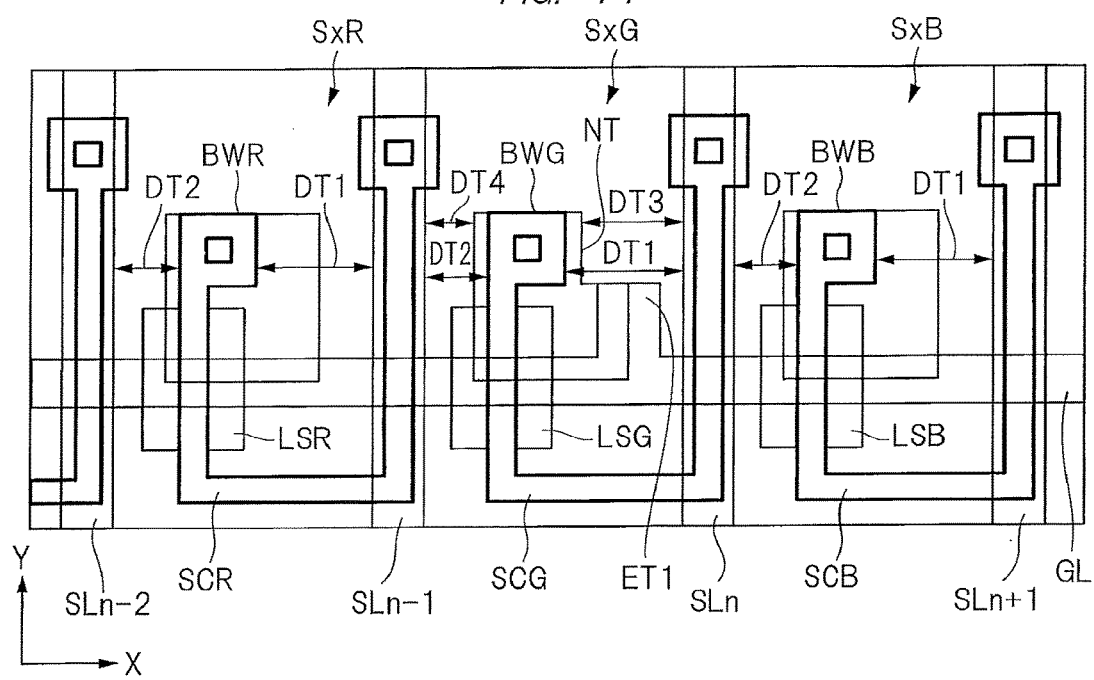
FIG. 14 is a plan view showing an example of arrangement of a pixel in a display device according to a modification example of the fourth embodiment.

Next, a modification example of the fourth embodiment will be described. FIG. 14 is a plan view showing an example of arrangement of a pixel in the display device according to the modification example of the fourth embodiment.

The display device according to the modification example of the present fourth embodiment is an example of combining the modification example of the second embodiment and the modification example of the third embodiment described above. That is, in the display device according to the modification example of the present fourth embodiment, as shown in FIG. 14, an application example to the transistor TrG for the green sub-pixel will be described.

The display device according to the modification example of the present fourth embodiment can obtain the same effects as those of the modification example of the second embodiment and the modification example of the third embodiment described above.

Fifth Embodiment

Figure 15:
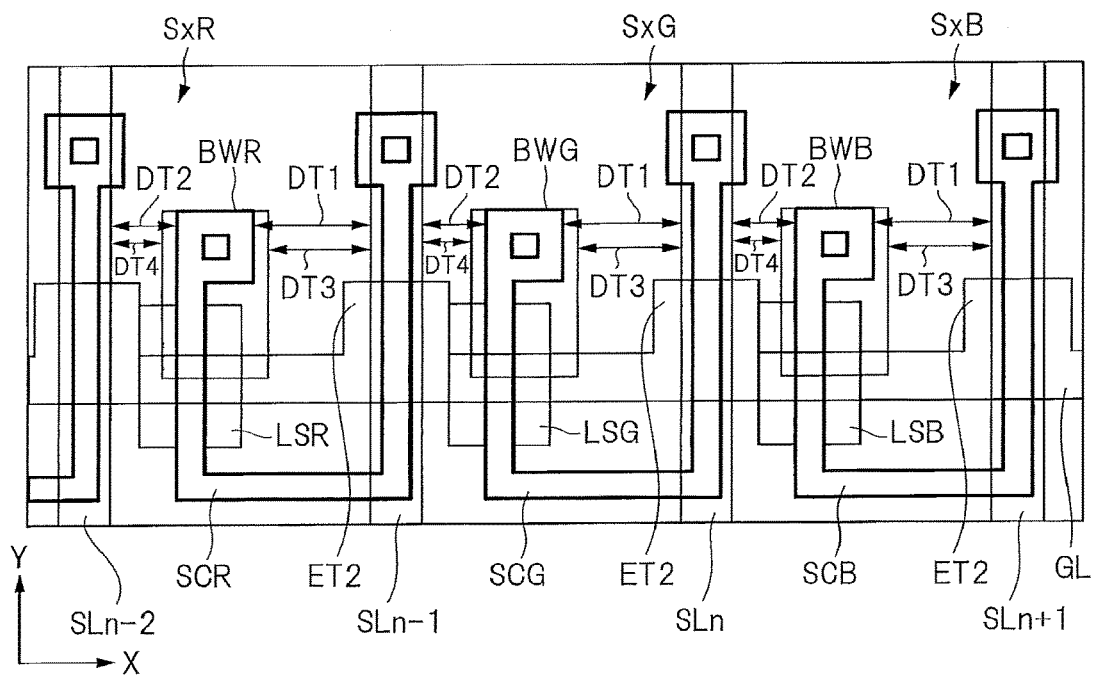
FIG. 15 is a plan view showing an example of arrangement of a pixel in a display device according to a fifth embodiment.

Arrangement of a pixel in a display device according to a fifth embodiment will be described. FIG. 15 is a plan view showing an example of the arrangement of the pixel in the display device according to the fifth embodiment. The present embodiment will mainly describe differences from the first to fourth embodiments described above.

As similar to the first embodiment, in the display device according to the present fifth embodiment, a distance DT1 between the first signal line and the first semiconductor layer is larger than a distance DT2 between the second signal line and the first semiconductor layer, and a distance DT3 between the first signal line and a base electrode BW is larger than a distance DT4 between the second signal line and the base electrode BW. Further, in the display device according to the present fifth embodiment, as shown in FIG. 15, a scanning line GL has a second extended portion ET2. In plan view, the second extended portion ET2 of the scanning line GL overlaps a first signal line SL. In this manner, a parasitic capacitance C4 acting between the scanning line GL and the first signal line SL of the pixel itself increases, so that a parasitic capacitance C1 acting between the first signal line SL of the pixel itself and the first base electrode BW can be smaller.

FIG. 15 shows an example in which the second extended portion ET2 protrudes and extends from the scanning line GL in the Y-axis direction and is wider (in the X-axis direction) than the first signal line SL. However, the second extended portion ET2 is not limited to this, and the second extended portion ET2 and the first signal line SL may be formed to overlap each other.

In the display device according to the present fifth embodiment, the second extended portion ET2 of the scanning line GL and the first signal line SL overlap each other more than the case in the first embodiment described above, so that the parasitic capacitance C1 acting between the first signal line SL of the pixel itself and the first base electrode BW can be further smaller, and the image quality can be improved.

Modification Example

Figure 16:
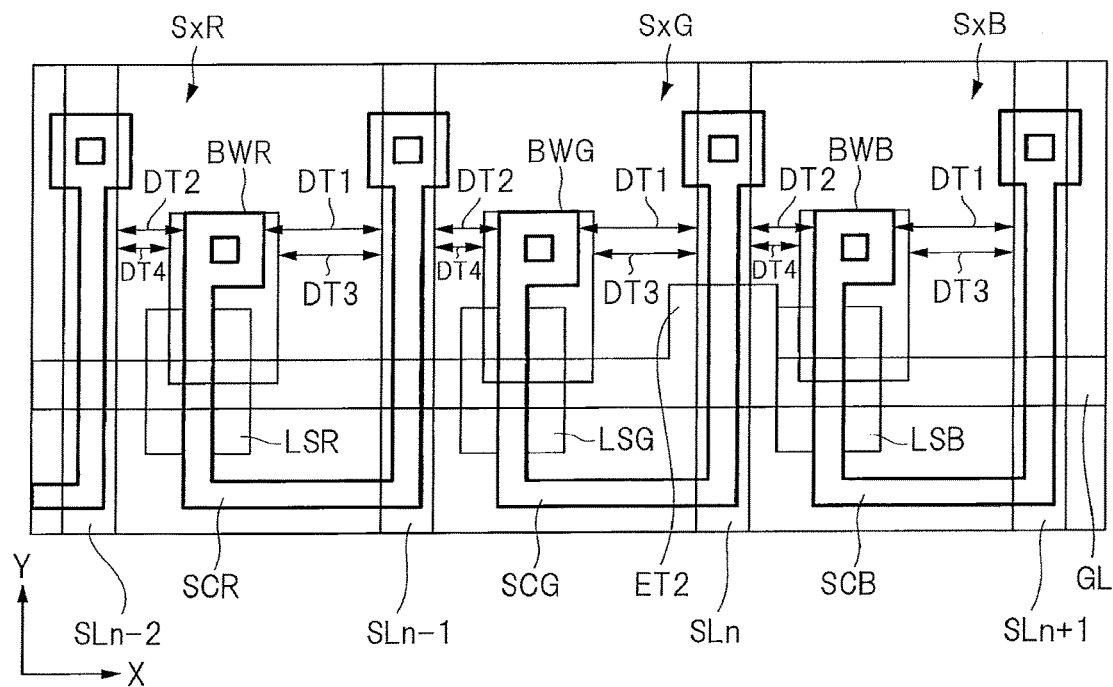
FIG. 16 is a plan view showing an example of arrangement of a pixel in a display device according to a modification example of the fifth embodiment.

Next, a modification example of the fifth embodiment will be described. FIG. 16 is a plan view showing an example of arrangement of a pixel in a display device according to a modification example of the fifth embodiment.

As shown in FIG. 16, the display device according to the modification example of the present fifth embodiment is an example of application of an arrangement to the transistor TrG for the green sub-pixel, the arrangement making the second extended portion ET2 of the scanning line GL to overlap the first signal line SL. Each corresponding portion of the transistors TrR and TrB for the red and blue sub-pixels other than the transistor TrG for the green sub-pixel is the same as that shown in FIG. 7 in the first embodiment described above.

Even in the application to the transistor TrG for the green sub-pixel as described in the display device according to the modification example of the fifth embodiment, the parasitic capacitance C1 acting between the first signal line SL of the pixel itself and the first base electrode BW can be small in the transistor TrG for the green sub-pixel, and therefore, the image quality can be improved.

Sixth Embodiment

Figure 17:
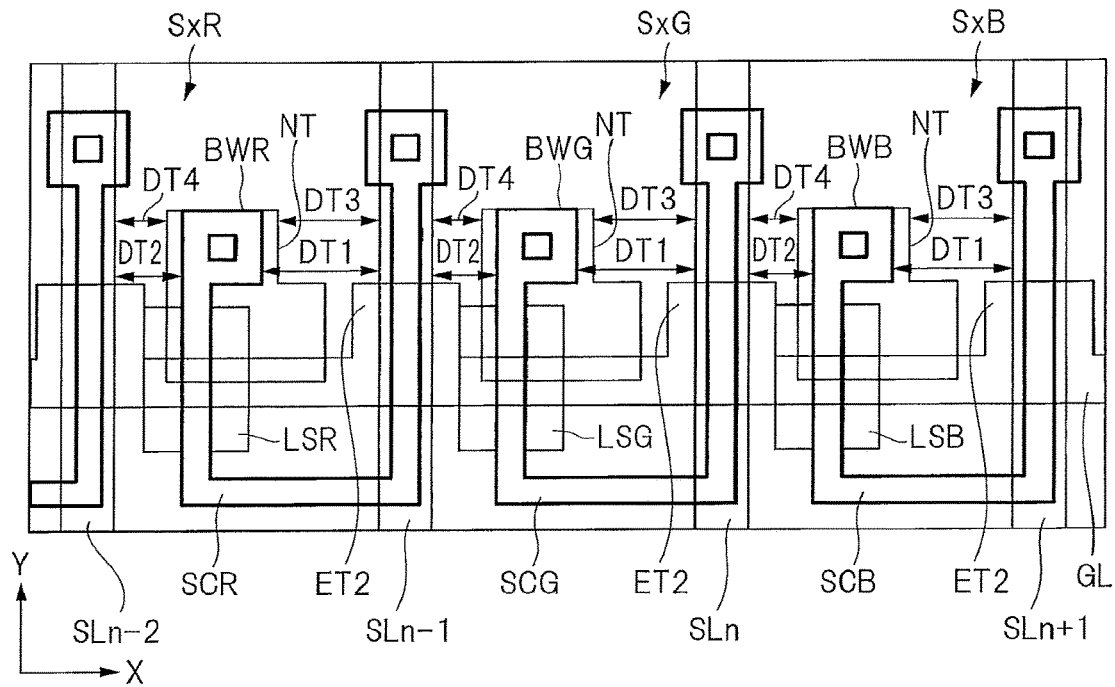
FIG. 17 is a plan view showing an example of arrangement of a pixel in a display device according to a sixth embodiment.

Arrangement of a pixel in a display device according to a sixth embodiment will be described. FIG. 17 is a plan view showing an example of the arrangement of the pixel in the display device according to the sixth embodiment. The present embodiment will mainly describe differences from the first to fifth embodiments described above.

The display device according to the sixth embodiment is an example of combining the second embodiment and the fifth embodiment. That is, in the display device according to the present sixth embodiment, as shown in FIG. 17, a first base electrode BW serving as a metal layer has a notched portion NT at a part closer to the first signal line SL. In plan view, a distance DT3 between the first signal line SL and the notched portion NT of the first base electrode BW is larger than a distance DT4 between a second signal line SL and the first base electrode BW. In addition, a scanning line GL has a second extended portion ET2. In plan view, the second extended portion ET2 of the scanning line GL overlaps the first base electrode BW.

The display device according to the present sixth embodiment can obtain the same effects as those of the second and fifth embodiments described above.

Modification Example

Figure 18:
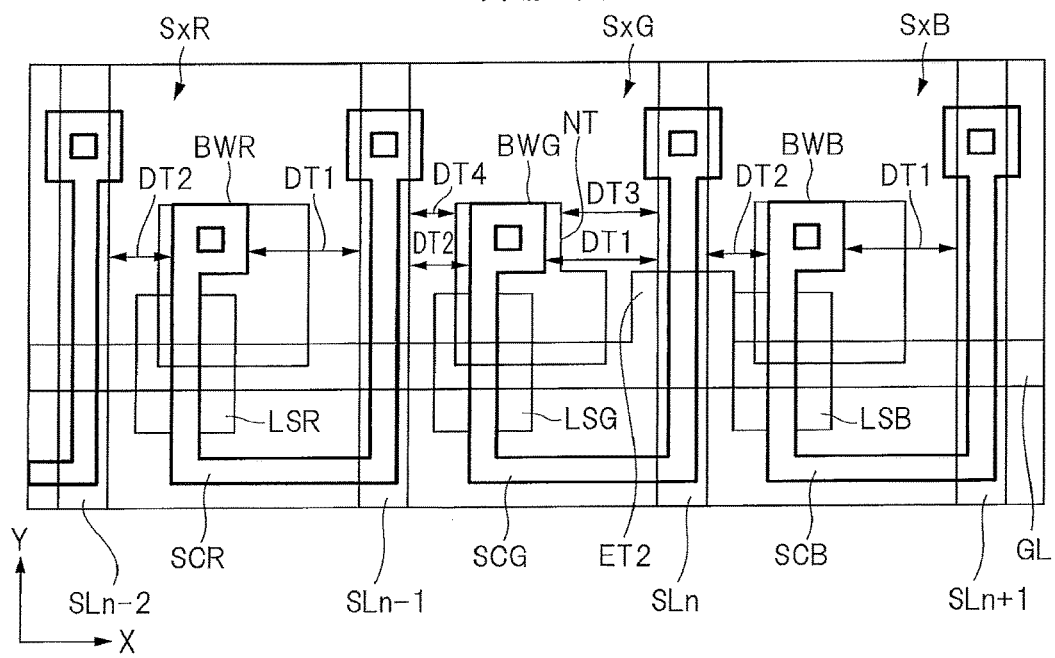
FIG. 18 is a plan view showing an example of arrangement of a pixel in a display device according to a modification example of the sixth embodiment.

Next, a modification example of the sixth embodiment will be described. FIG. 18 is a plan view showing an example of arrangement of a pixel in the display device according to the modification example of the sixth embodiment.

The display device according to the modification example of the present sixth embodiment is an example of combining the modification example of the second embodiment and the modification example of the fifth embodiment described above. That is, as shown in FIG. 18, the display device according to the modification example of the present sixth embodiment is an example of application to the transistor TrG for the green sub-pixel.

The display device according to the modification example of the present sixth embodiment can obtain the same effects as those of the modification example of the second embodiment and the modification example of the fifth embodiment described above.

Seventh Embodiment

Figure 19:
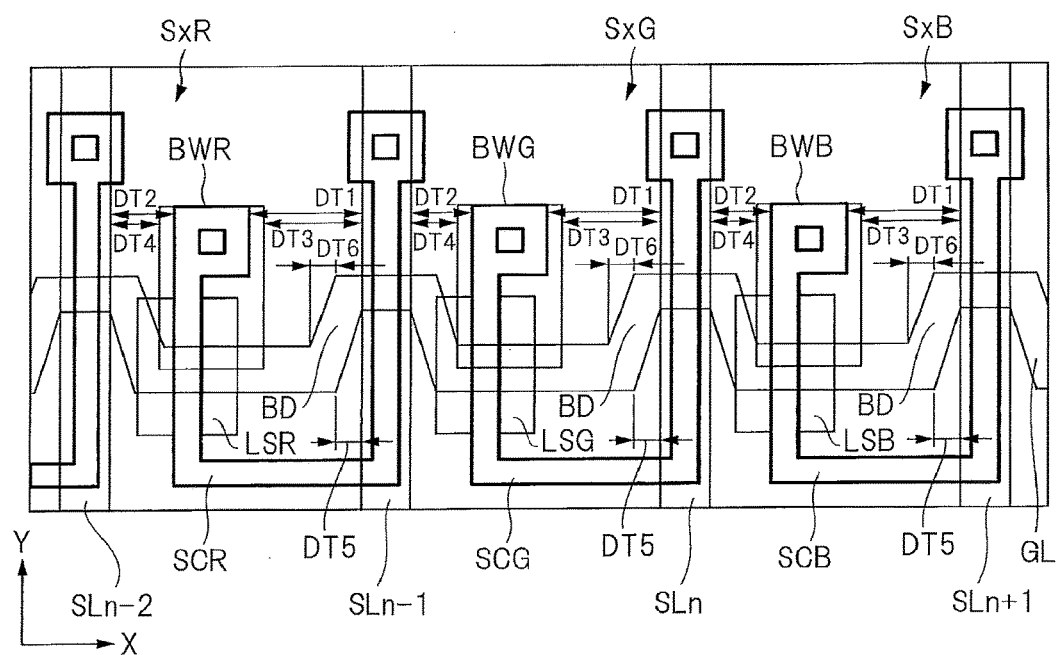
FIG. 19 is a plan view showing an example of arrangement of a pixel in a display device according to a seventh embodiment.

Arrangement of a pixel in a display device according to a seventh embodiment will be described. FIG. 19 is a plan view showing an example of the arrangement of the pixel in the display device according to the seventh embodiment. The present embodiment will mainly describe differences from the first to sixth embodiments described above.

As similar to the first embodiment, in the display device according to the present seventh embodiment, a distance DT1 between the first signal line and the first semiconductor layer is larger than a distance DT2 between the second signal line and the first semiconductor layer, and a distance DT3 between the first signal line and a base electrode BW is larger than a distance DT4 between the second signal line and the base electrode BW. Further, in the display device according to the present seventh embodiment, as shown in FIG. 19, a scanning line GL has a bent portion BD. In plan view, a distance DT5 between the bent portion BD of the scanning line GL and a first signal line SL is equal to a distance DT6 between the bent portion BD of the scanning line GL and a first base electrode BW serving as a metal layer. The distances DT5 and DT6 are distances in the X-axis direction in FIG. 19. In this manner, a parasitic capacitance C3 acting between the scanning line GL and the first base electrode BW and a parasitic capacitance C4 acting between the scanning line GL and the first signal line SL of the pixel itself are made larger, so that a parasitic capacitance C1 acting between the first signal line SL of the pixel itself and the first base electrode BW can be smaller.

FIG. 19 shows an example in which the bent portion BD is formed to have a protruding shape in the Y-axis direction whose top is formed at an intersecting portion between the bent portion and the first signal line SL. However, the bent portion is not limited to this, and the bent portion may be formed so that the distance DT5 between the bent portion BD and the first signal line SL becomes equal to the distance DT6 between the bent portion BD and the first base electrode BW.

In the display device according to the seventh embodiment, the distance DT5 between the bent portion BD of the scanning line GL and the first signal line SL becomes equal to the distance DT6 between the bent portion BD of the scanning line GL and the first base electrode BW more than the case in the first embodiment described above, so that the parasitic capacitance C1 acting between the first signal line SL of the pixel itself and the first base electrode BW can be further smaller, and the image quality can be improved.

Modification Example

Figure 20:
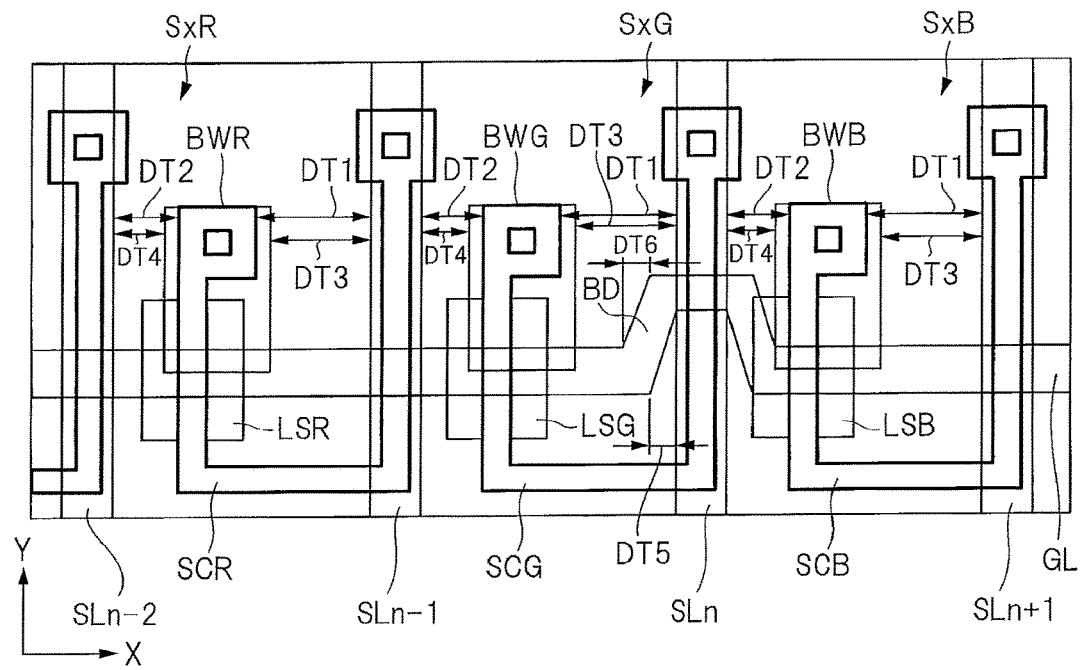
FIG. 20 is a plan view showing an example of arrangement of a pixel in a display device according to a modification example of the seventh embodiment.

Next, a modification example of the seventh embodiment will be described. FIG. 20 is a plan view showing an example of arrangement of a pixel in a display device according to a modification example of the seventh embodiment.

As shown in FIG. 20, the display device according to the modification example of the present seventh embodiment is an example of application of arrangement to the transistor TrG for the green sub-pixel, the arrangement making a distance DT5 between the bent portion BD of the scanning line GL and the first signal line SL to be equal to a distance DT6 between the bent portion BD of the scanning line GL and the first base electrode BW. Each corresponding portion of the transistors TrR and TrB for the red and blue sub-pixels other than the transistor TrG for the green sub-pixel is the same as that shown in FIG. 7 in the first embodiment described above.

Even in the application to the transistor TrG for the green sub-pixel as described in the display device according to the modification example of the seventh embodiment, the parasitic capacitance C1 acting between the first signal line SL of the pixel itself and the first base electrode BW can be small in the transistor TrG for the green sub-pixel, and therefore, the image quality can be improved.

Eighth Embodiment

Figure 21:
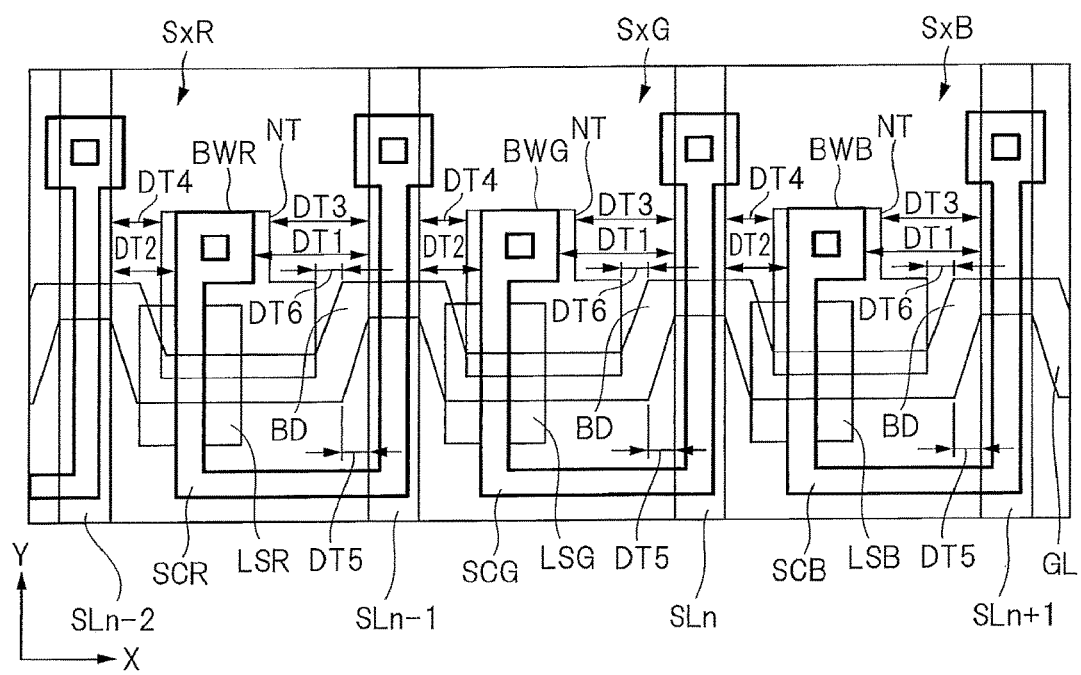
FIG. 21 is a plan view showing an example of arrangement of a pixel in a display device according to an eighth embodiment.

Arrangement of a pixel in a display device according to an eighth embodiment will be described. FIG. 21 is a plan view showing an example of the arrangement of the pixel in the display device according to the eighth embodiment. The present embodiment will mainly describe differences from the first to seventh embodiments described above.

The display device according to the eighth embodiment is an example of combining the second embodiment and the seventh embodiment. That is, in the display device according to the present eighth embodiment, as shown in FIG. 21, a first base electrode BW serving as a metal layer has a notched portion NT at a part closer to the first signal line SL. In plan view, a distance DT3 between the first signal line SL and the notched portion NT of the first base electrode BW is larger than a distance DT4 between a second signal line SL and the first base electrode BW. In addition, a scanning line GL has a bent portion BD. In plan view, a distance DT5 between the bent portion BD of the scanning line GL and a first signal line SL is equal to a distance DT6 between the bent portion BD of the scanning line GL and a first base electrode BW.

The display device according to the present eighth embodiment can obtain the same effects as those of the modification example of the second embodiment and the modification example of the seventh embodiment described above.

Modification Example

Figure 22:
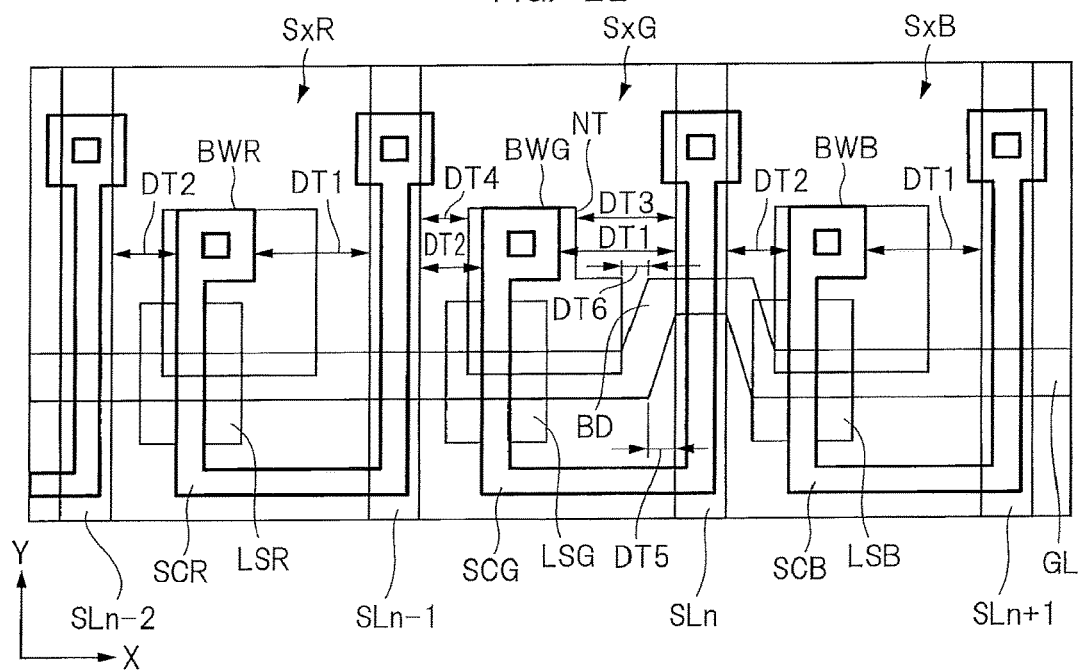
FIG. 22 is a plan view showing an example of arrangement of a pixel in a display device according to a modification example of the eighth embodiment.

Next, a modification example of the eighth embodiment will be described. FIG. 22 is a plan view showing an example of arrangement of a pixel in the display device according to the modification example of the eighth embodiment.

The display device according to the modification example of the present eighth embodiment is an example of combining the modification example of the second embodiment and the modification example of the seventh embodiment described above. That is, as shown in FIG. 22, the display device according to the modification example of the present eighth embodiment is an example of application to the transistor TrG for the green sub-pixel.

The display device according to the modification example of the present eighth embodiment can obtain the same effects as those of the modification example of the second embodiment and the modification example of the seventh embodiment described above.

In the foregoing, the invention made by the present inventors has been concretely described based on the embodiments. However, it is needless to say that the present invention is not limited to the foregoing embodiments and various modifications and alterations can be made within the scope of the present invention.

In the above-described embodiments, the case of the liquid crystal display device has been exemplified as the disclosure example. However, as another application example, various types of flat-panel display devices such as an organic EL display device, other self-luminous type display device, and an electronic-paper type display device having an electrophoretic element can be exemplified. And, it is needless to say that the present invention is applicable to display devices ranging from small- or middle-sized one to large-sized one without any particular limitation.

In the scope of the concept of the present invention, various modification examples and alteration examples could have been easily anticipated by those who skilled in the art, and it would be understood that these various modification examples and alteration examples belong to the scope of the present invention.

For example, the ones obtained by appropriate addition, removal, or design-change of the components to/from/into each of the above-described embodiments by those who skilled in the art or obtained by addition, omitting, or condition-change of the step to/from/into each of the above-described embodiments are also within the scope of the present invention as long as they include the concept of the present invention.

What is claimed is:

1. A display device comprising, on an insulating substrate:
a plurality of scanning lines;
a plurality of signal lines;
a plurality of sub-pixel regions each surrounded by a pair of the scanning lines and a pair of the signal lines;
a plurality of semiconductor layers formed in sub-pixel region, respectively; and
a metal layer connected to one end of the semiconductor layer,
wherein the other end of the semiconductor layer is connected to one of the pair of signal lines,
when it is assumed that a signal line connected to the semiconductor layer is a first signal line while a signal line not connected to the semiconductor layer is a second signal line in each of the sub-pixel regions, a distance between the first signal line and the semiconductor layer is larger than a distance between the second signal line and the semiconductor layer at a connecting position between the semiconductor layer and the metal layer in plan view.

2. The display device according to claim 1,
wherein a distance between the first signal line and the metal layer is larger than a distance between the second signal line and the metal layer in plan view.

3. The display device according to claim 2,
wherein the metal layer includes a concave portion at a part closer to the first signal line in an extending direction of the scanning line.

4. The display device according to claim 2,
wherein the scanning line includes a first extended portion extending in a direction parallel to the signal line, and
the first extended portion of the scanning line and the metal layer overlap each other between the semiconductor layer and the first signal line in plan view.

5. The display device according to claim 2,
wherein the metal layer includes a concave portion at a part closer to the first signal line in an extending direction of the scanning line,
a distance between the first signal line and the metal layer is larger than a distance between the second signal line and the metal layer in plan view,
the scanning line includes a first extended portion extending in a direction parallel to the signal line, and
the first extended portion of the scanning line and the metal layer overlap each other between the semiconductor layer and the first signal line in plan view.

6. The display device according to claim 2,
wherein the scanning line includes a second extended portion extending in a direction parallel to the signal line, and
the second extended portion of the scanning line and the first signal line overlap each other in plan view.

7. The display device according to claim 2,
wherein the metal layer includes a concave portion at a part closer to the first signal line in an extending direction of the scanning line,
a distance between the first signal line and the metal layer is larger than a distance between the second signal line and the metal layer in plan view,
the scanning line includes a second extended portion extending in a direction parallel to the signal line, and
the second extended portion of the scanning line and the signal line overlap each other between the semiconductor layer and the first signal line in plan view.

8. The display device according to claim 2,
wherein the scanning line includes a bent portion protruding toward a connection position between the semiconductor layer and the first signal line, and
a distance between the bent portion of the scanning line and the first signal line is substantially equal to a distance between the bent portion of the scanning line and the metal layer in plan view.

9. The display device according to claim 2,
wherein the metal layer includes a concave portion at a part closer to the first signal line in an extending direction of the scanning line,
a distance between the first signal line and the metal layer is larger than a distance between the second signal line and the metal layer in plan view,
the scanning line includes a bent portion protruding toward a connection position between the semiconductor layer and the first signal line, and
a distance between the bent portion of the scanning line and the first signal line is substantially equal to a distance between the bent portion of the scanning line and the metal layer in plan view.

10. The display device according to claim 2,
wherein the sub-pixel region displays any color of red, green and blue.

11. The display device according to claim 10,
wherein the metal layer includes a concave portion at a part closer to the first signal line in an extending direction of the scanning line,
the scanning line includes a bent portion protruding toward a connection position between the semiconductor layer and the first signal line, and
the concave portion or the bent portion is formed in the sub-pixel region displaying green.

* * * * *